US011789612B2

(12) United States Patent
Inbar et al.

(10) Patent No.: US 11,789,612 B2
(45) Date of Patent: Oct. 17, 2023

(54) PLANE PROGRAMMING SCHEME FOR NON-VOLATILE MEMORY WITH LARGE BLOCK SIZES

(71) Applicant: SanDisk Technologies LLC, Addison, TX (US)

(72) Inventors: Karin Inbar, Ramat Hasharon (IL); Sahil Sharma, San Jose, CA (US); Grishma Shah, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 111 days.

(21) Appl. No.: 16/903,196

(22) Filed: Jun. 16, 2020

(65) Prior Publication Data

US 2021/0389879 A1 Dec. 16, 2021

(51) Int. Cl.
*G06F 3/06* (2006.01)

(52) U.S. Cl.
CPC ............ *G06F 3/0611* (2013.01); *G06F 3/064* (2013.01); *G06F 3/0656* (2013.01); *G06F 3/0679* (2013.01)

(58) Field of Classification Search
CPC .......... G06F 3/06; G06F 3/0611; G06F 3/064; G06F 3/0656; G06F 3/0679; G06F 3/061; G06F 3/0659; G06F 3/0688; H01L 27/11; G11C 2211/5621; G11C 11/5628; G11C 16/10; G11C 16/0483
USPC ........................................................... 711/3
See application file for complete search history.

(56) References Cited

U.S. PATENT DOCUMENTS

| | | | |
|---|---|---|---|
| 7,082,056 B2* | 7/2006 | Chen | G11C 11/5642 365/185.21 |
| 8,850,100 B2 | 9/2014 | Steiner et al. | |
| 9,329,989 B2 | 5/2016 | Sprouse et al. | |
| 9,330,765 B2 | 5/2016 | Kim | |
| 9,645,765 B2 | 5/2017 | Vanaraj et al. | |
| 10,248,515 B2 | 4/2019 | Srinivasan et al. | |
| 2008/0034154 A1* | 2/2008 | Lee | G11C 16/0408 711/E12.001 |
| 2016/0313931 A1* | 10/2016 | Song | G11C 16/10 |
| 2019/0348127 A1 | 11/2019 | Chin et al. | |
| 2021/0255949 A1* | 8/2021 | Guda | G06F 12/0846 |

OTHER PUBLICATIONS http://bwrcs.eecs.berkeley.edu/Classes/icdesign/ee141_s07/Lectures/Lecture25-Memory_6up.pdf (retrieved Oct. 7, 2021). (Year : 2007).*
https://en.wikipedia.org/wiki/Flash_memory (Year: 2021).*

(Continued)

*Primary Examiner* — Michael Krofcheck
(74) *Attorney, Agent, or Firm* — Vierra Magen Marcus LLP

(57) ABSTRACT

For a non-volatile memory system with a multi-plane memory die having a large block size, to be able to more readily accommodate zone-based host data using zones that are of a smaller size that the block size on the memory, the memory system assigns data from different zones to different subsets of the planes of a common memory die. The memory system is configured to accumulate the data from the different zones into different write queues and then assemble the data from the different write zones into pages or partial pages of data that can be simultaneously programmed into memory cells connected to different word lines that are in different sub-blocks of different blocks in the corresponding assigned planes of the die.

20 Claims, 21 Drawing Sheets

(56) References Cited

OTHER PUBLICATIONS

Col, Damien, "Understanding Flash Memory," Dec. 18, 2017, eeNews Europe, https://www.eenewsembedded.com/en/understanding-flash-memory/ (Year: 2017).*

* cited by examiner

Figure 7E
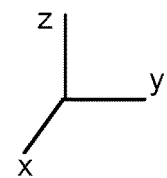
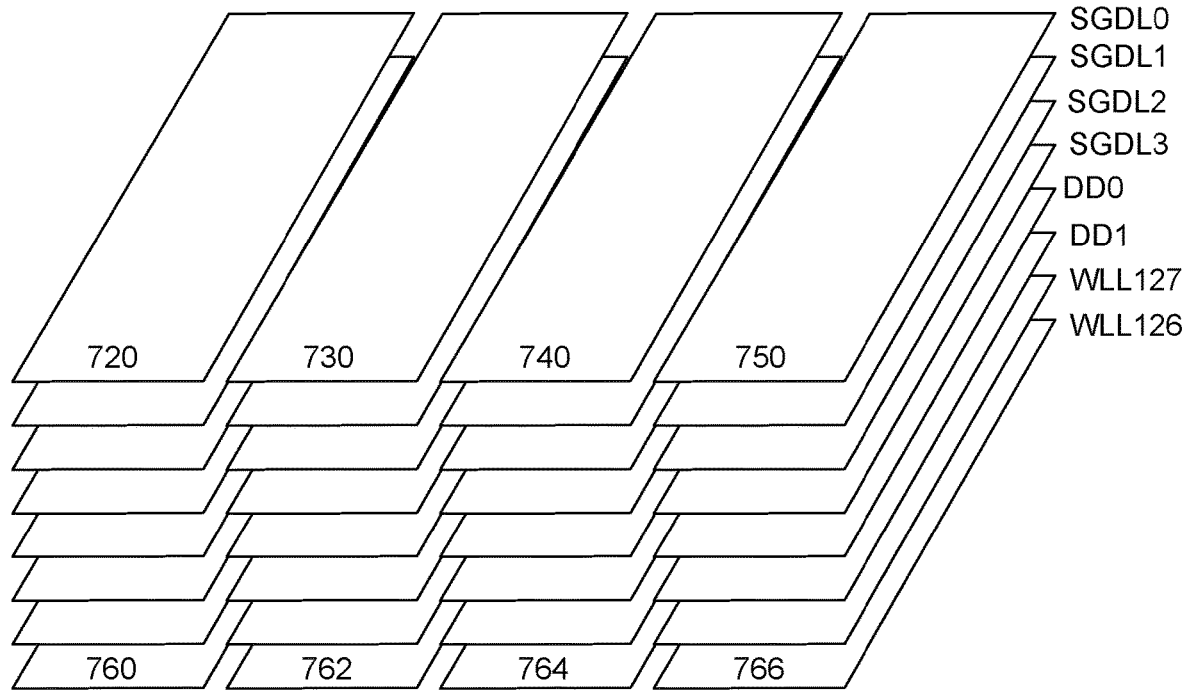
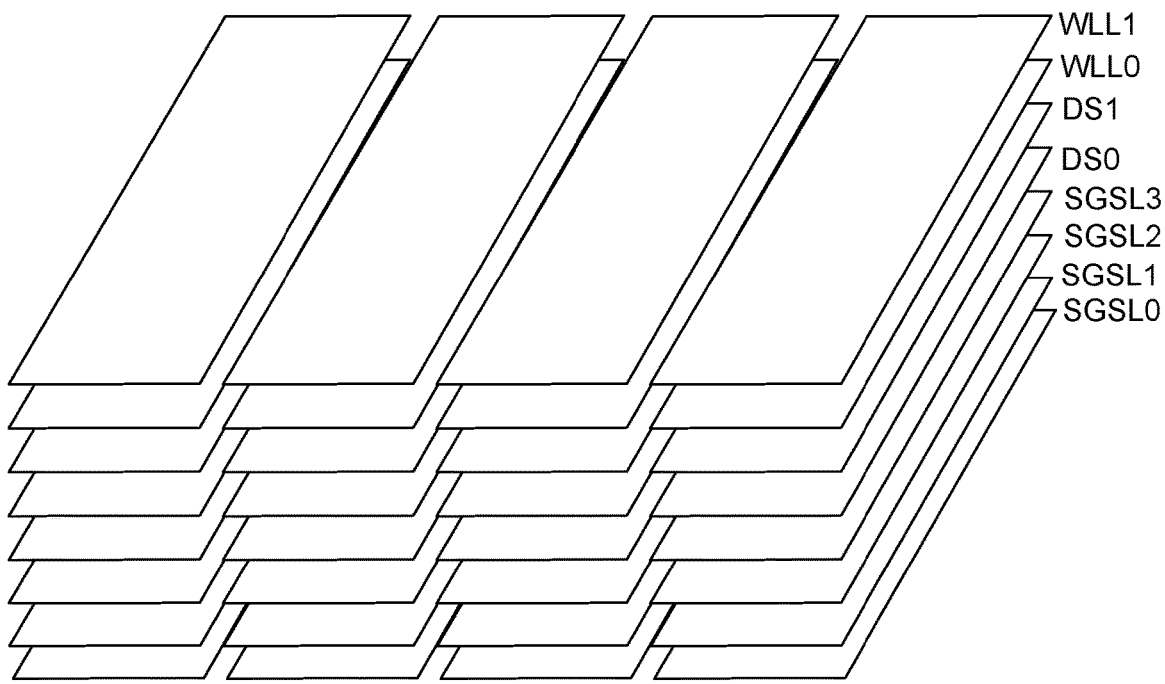

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

PLANE PROGRAMMING SCHEME FOR NON-VOLATILE MEMORY WITH LARGE BLOCK SIZES

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). It is important that the process for programming data into the memory system be fast so that the host device (or other client) does not have to wait very long for the memory system to finish the programming.

BRIEF DESCRIPTION OF THE DRAWINGS

Like-numbered elements refer to common components in the different figures.

FIG. 7E depicts a view of the select gate layers and word line layers.

DETAILED DESCRIPTION

In some embodiments, a non-volatile memory system includes a memory structure including large numbers of non-volatile memory cells that persistently store data. To increase performance during programming, the plurality of memory cells are arranged in multiple planes such that the memory system can perform programming for multiple planes in parallel, enabling more memory cells to be programmed during a given time period. To further increase the storage capacity of non-volatile memory, the size and degree of parallelism of such devices continues to increase. This can lead to conflicts with host devices that use zone based storage that favor a zone size that is smaller than the block size at which the memory device is structured.

To realize the benefits of multiple plane operation while still being able to accommodate smaller zone sizes, multiple zones are assigned to different planes of a memory die. The host data for the different zones can be separately accumulated and then assembled into pages or partial pages of data to write into the memory die. The data from the different zones can simultaneously be programmed into memory cells of the array connected to different word lines that are in different sub-blocks of different blocks in different planes of the die.

Figure 1:
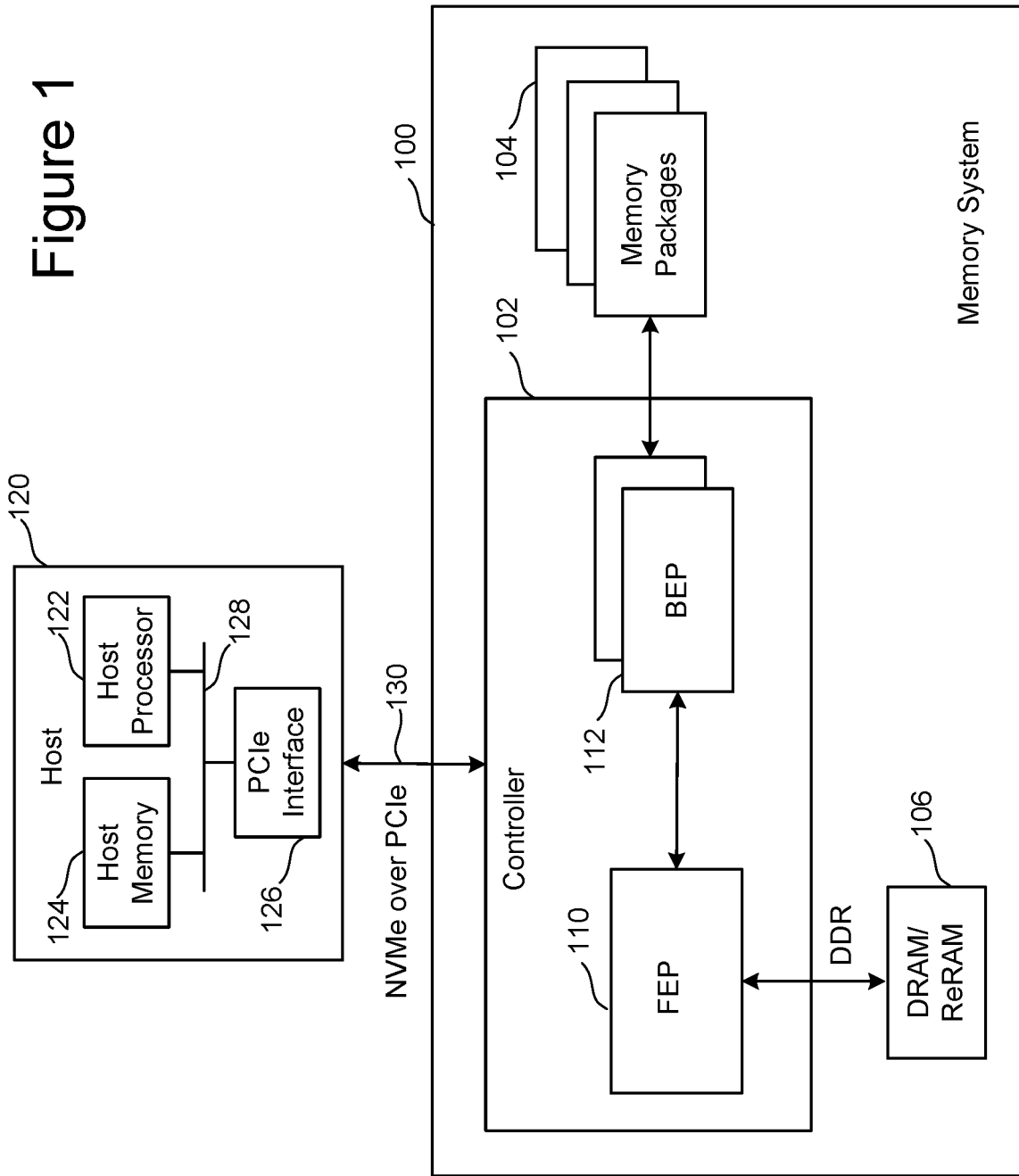
FIG. 1 is a block diagram of one embodiment of a memory system connected to a host.

FIG. 1 is a block diagram of one embodiment of a memory system 100 connected to a host 120. Memory system 100 can implement the technology proposed herein, where zone based data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two-dimensional NAND flash memory and/or three-dimensional NAND flash memory). In other embodiments, the memory package can include other types of memory.

Controller 102 communicates with host 120 via interface or bus 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
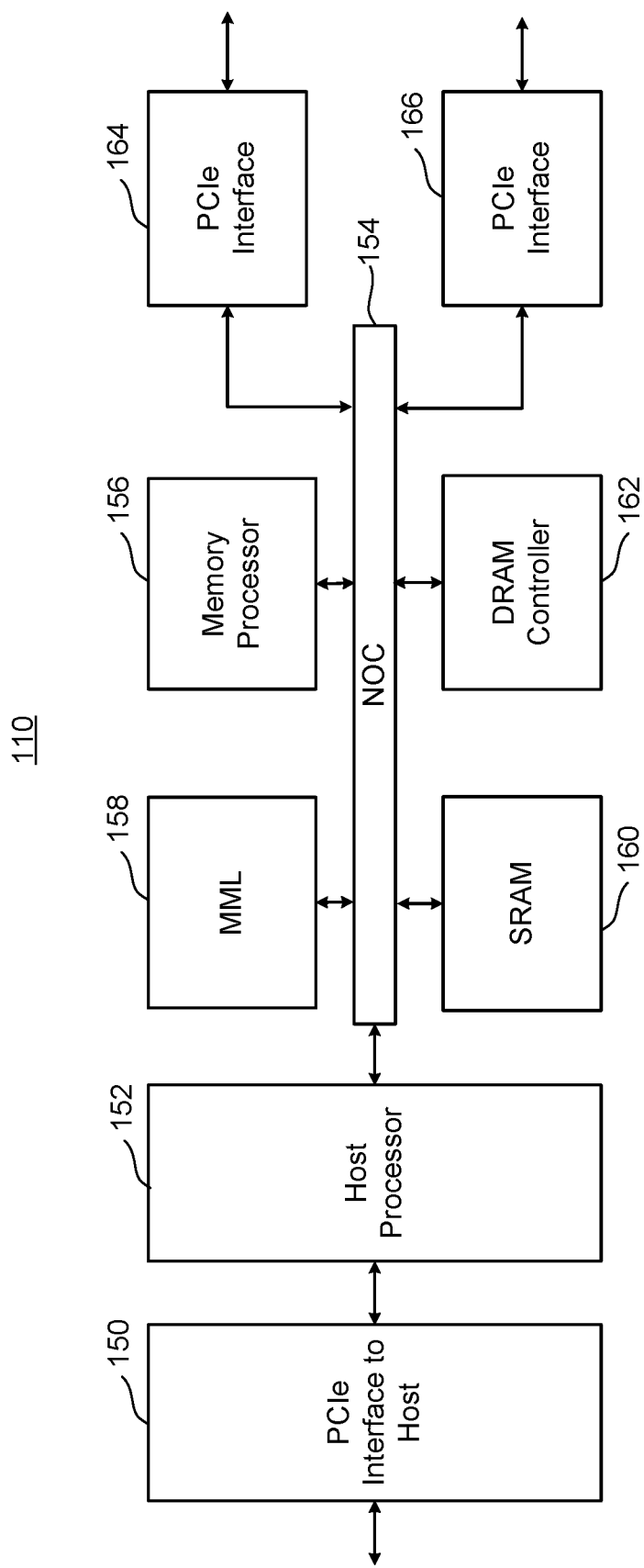
FIG. 2 is a block diagram of one embodiment of a Front End Processor Circuit. In some embodiments, the Front End Processor Circuit is part of a controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 or 6A below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
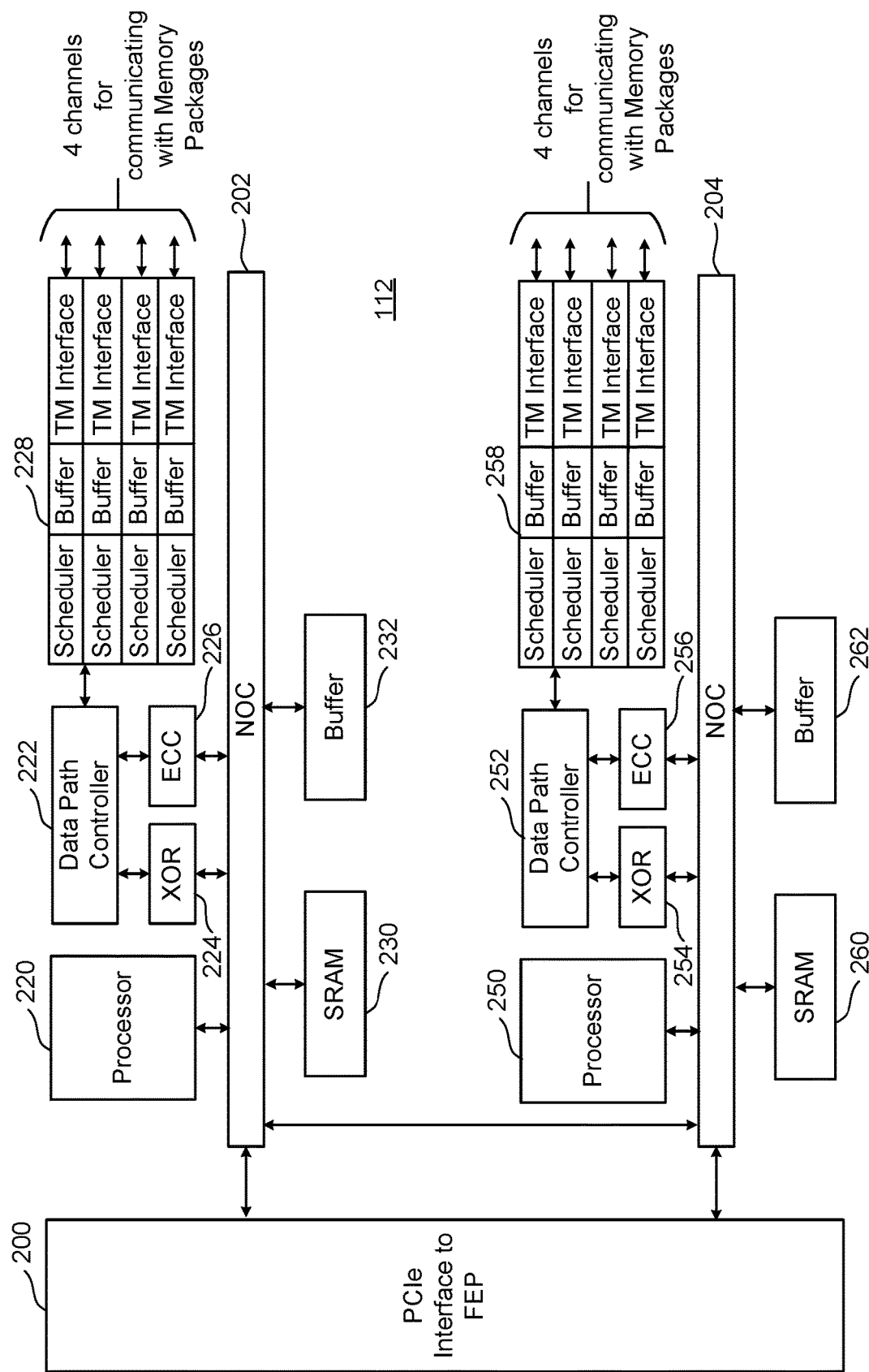
FIG. 3 is a block diagram of one embodiment of a Back End Processor Circuit. In some embodiments, the Back End Processor Circuit is part of a controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
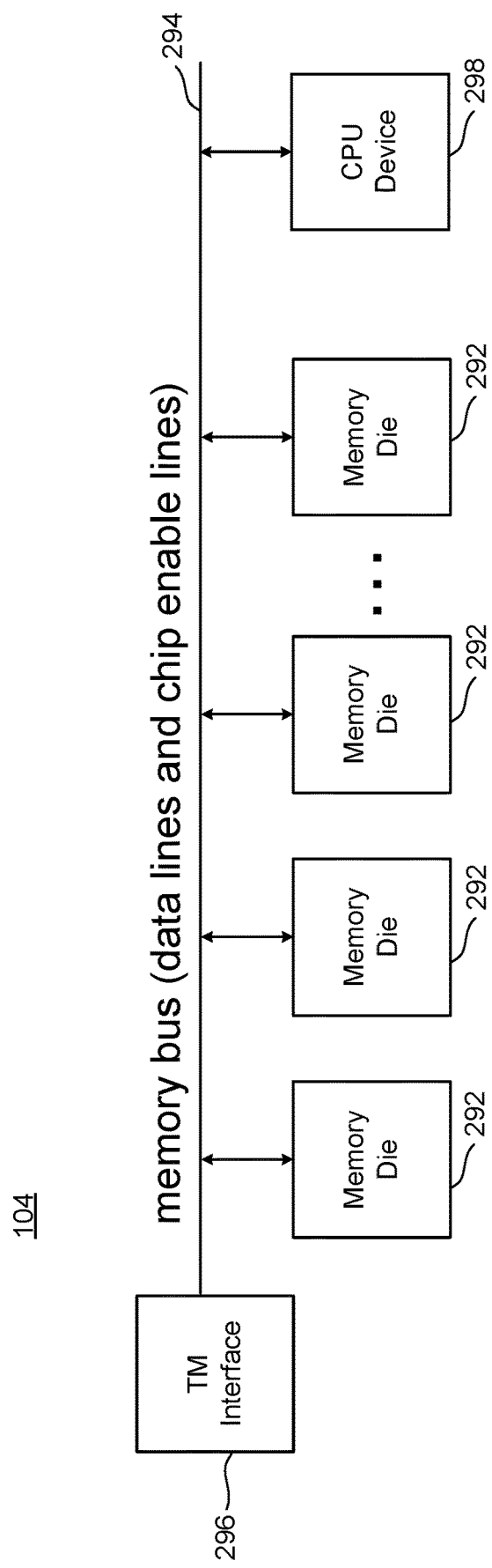
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In some embodiments, the memory package can also include a processor, CPU device 298, such as a RISC-V CPU along with some amount of RAM to help implement some of capabilities described below. The technology described herein is not limited to any particular number of memory die.

Figure 5:
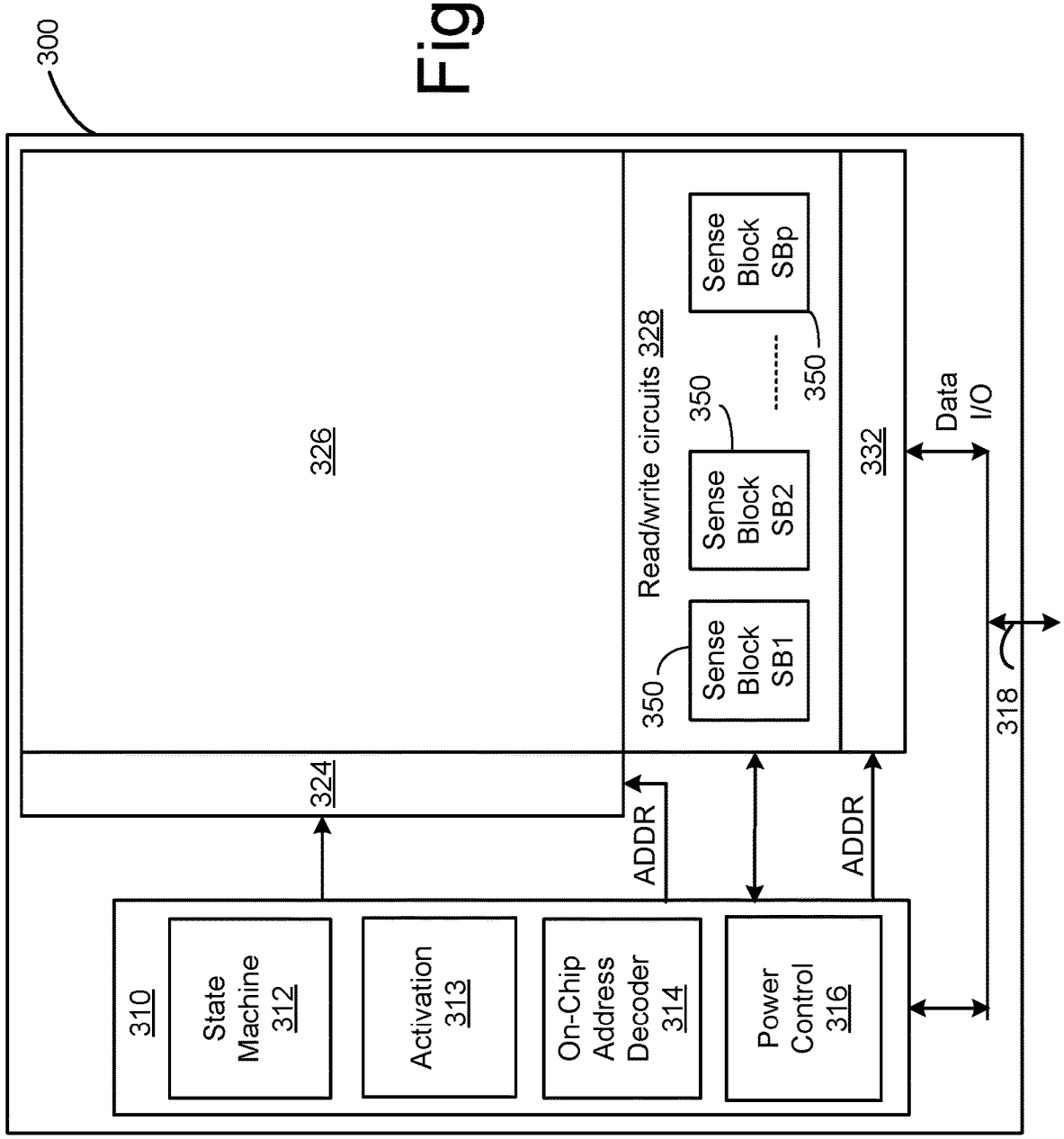
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three-dimensional memory array of non-volatile memory cells in which multiple memory levels are formed above a single substrate, such as a wafer. The memory structure may comprise any type of non-volatile memory that are formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721, 662, incorporated herein by reference in its entirety.

In another embodiment, memory structure 326 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

The elements of FIG. 5 can be grouped into two parts, the memory structure 326 of the memory cells and the peripheral circuitry, including all of the other elements. An important characteristic of a memory circuit is its capacity, which can be increased by increasing the relative area of the memory die 300 that is given over to the memory structure 326; however, this reduces the area of the memory die 300 available for the peripheral circuitry. This can place quite severe restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is the amount of area to devote to the memory structure 326 and the amount of area to devote to the peripheral circuitry.

Another area in which the memory structure 326 and the peripheral circuitry are often at odds is in the processing involved in forming these regions. Since these regions often involve differing processing technologies, there will be a trade-off in having differing technologies on a single die. For example, when the memory structure 326 is NAND flash, this is an NMOS structure, while the peripheral circuitry is often CMOS based. Sense amplifier circuits in the sense blocks 350, charge pumps in the power control block 316, logic elements in the state machine 312, and other peripheral circuitry often employ PMOS devices. Processing operations optimized for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
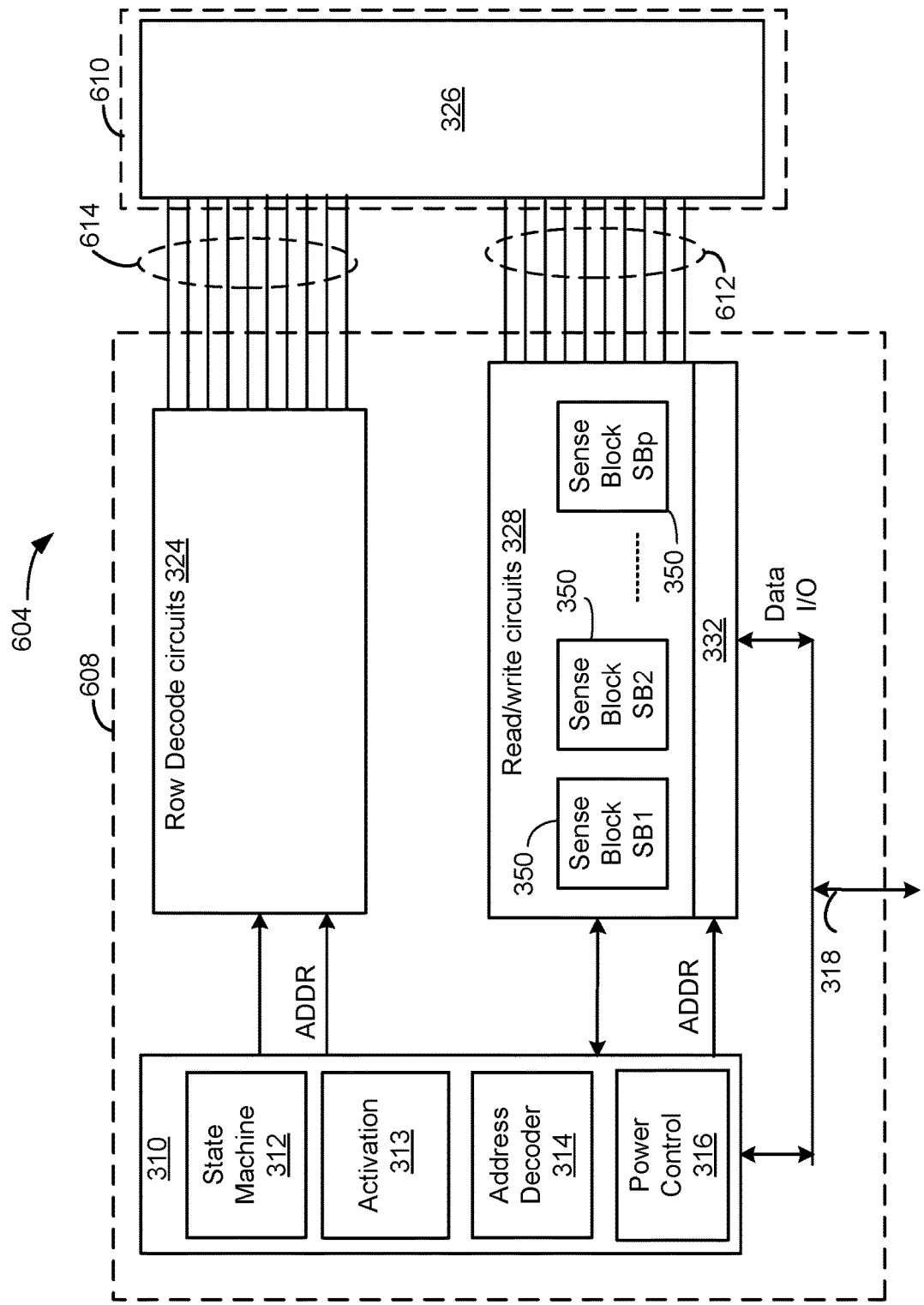
FIGS. 6A and 6B show an alternative arrangement to the arrangement of FIG. 5, which may be implemented using wafer-to-wafer bonding to provide a bonded die pair.
Figure 6B:
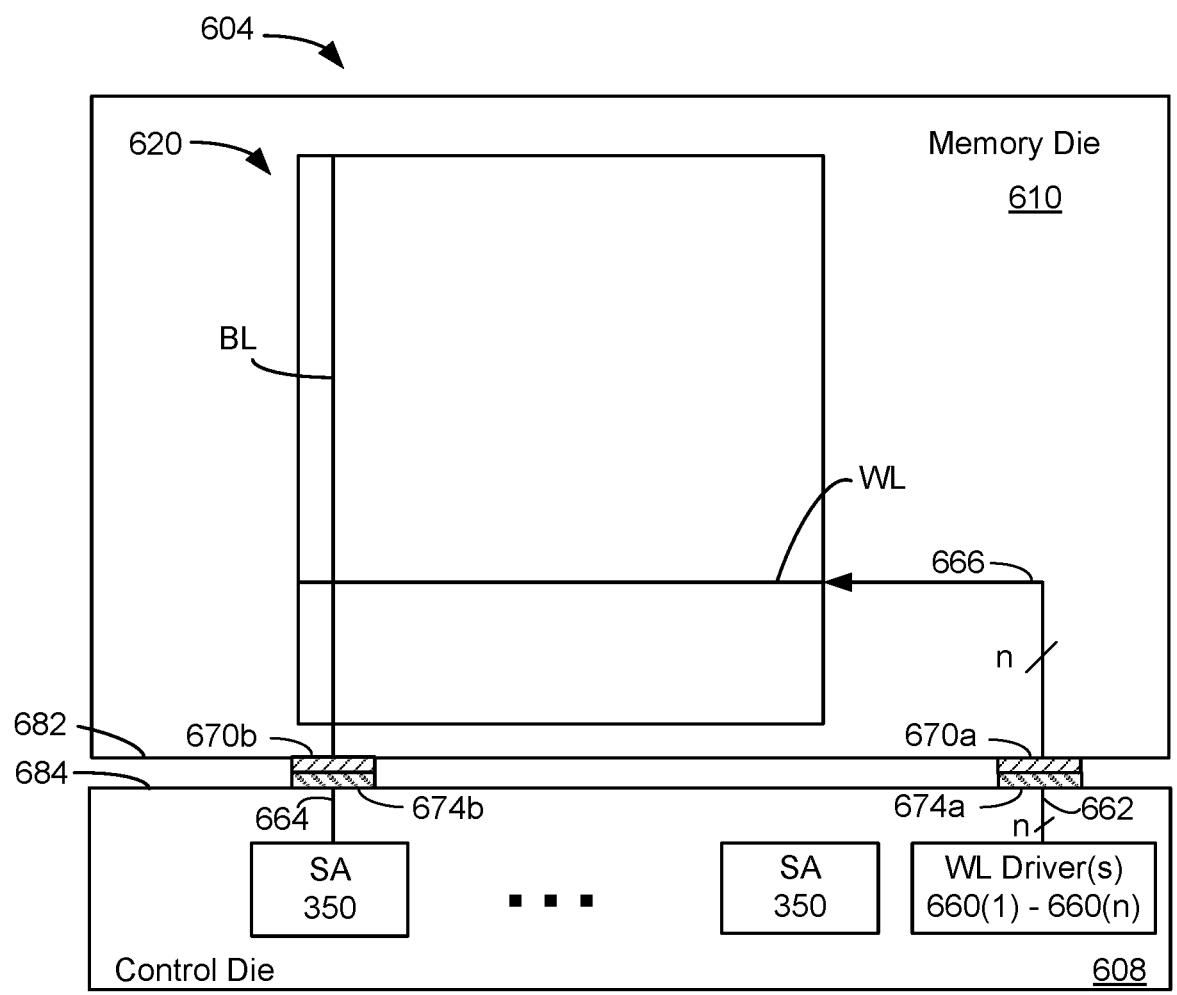

FIGS. 6A and 6B shows an alternative arrangement to the arrangement of FIG. 5, which may be implemented using wafer-to-wafer bonding to provide a bonded die pair 604. FIG. 6A shows an example of the peripheral circuitry, including control circuits, formed in a peripheral circuit or control die 608 coupled to memory structure 326 formed in the memory die 610. Common components are numbered as in FIG. 5. It can be seen that control circuitry 310, read/write circuits 328, and row decoder 324 (which may be formed by a CMOS process) are located in control die 608. Additional elements, such as functionalities from controller 102 can also be moved into the control die 608. Control circuitry 310, read/write circuits 328, row decoder 324, and column decoder 332 may be formed by a common process (e.g. CMOS process), so that adding elements and functionalities more typically found on a memory controller 102 may require few or no additional process steps (i.e. the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control die 608 may not require any additional process steps.

FIG. 6A shows read/write circuits 328 on the control die 608 coupled to memory structure 326 on the memory die 610 through electrical paths 612. For example, electrical paths 612 may provide electrical connection between read/write circuits 328 and bit lines of memory structure 326. Electrical paths may extend from read/write circuits 328 in control die 608 through pads on control die 608 that are bonded to corresponding pads of the memory die 610, which are connected to bit lines of memory structure 326. Each bit line of memory structure 326 may have a corresponding electrical path in electrical paths 612, including a pair of bonded pads, that connects to read/write circuits 328. Similarly, row decoder circuits 324 are coupled to memory structure 326 through electrical paths 614. Each of electrical path 614 may correspond to a word line, dummy word line, or select gate line. Additional electrical paths may also be provided between control die 608 and memory die 610.

FIG. 6B is a block diagram showing more detail on the arrangement of one embodiment of the integrated memory assembly of bonded die pair 604. Memory die 610 contains a plane 620 or array of memory cells. The memory die 610 may have additional planes or arrays. One representative bit line (BL) and representative word line (WL) is depicted for each plane or array 620. There may be thousands or tens of thousands of such bit lines per each plane or array 620. In one embodiment, an array or plane represents a groups of connected memory cells that share a common set of unbroken word lines and unbroken bit lines.

Control die 608 includes a number of sense amplifiers (SA) 350. Each sense amplifier 350 is connected to one bit line or may be connected to multiple bit lines in some embodiments. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 608 includes a number of word line drivers 660(1)-660(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 (e.g., part of Power Control 316) provide voltages to the word lines in memory die 610. As discussed above with respect to FIG. 6A, the control die 608 may also include charge pumps, voltage generators, and the like that are not represented in FIG. 6B, which may be used to provide voltages for the word line drivers 660 and/or the bit line drivers.

The memory die 610 has a number of bond pads 670a, 670b on a first major surface 682 of memory die 610. There may be "n" bond pads 670a, to receive voltages from a corresponding "n" word line drivers 660(1)-660(n). There may be one bond pad 670b for each bit line associated with plane 620. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 604. For example, the data bus between the memory controller 102 and the integrated memory assembly 604 may, for example, provide for eight, sixteen, or perhaps 32 bits to be transferred in parallel. However, the data bus between the memory controller 102 and the integrated memory assembly 604 is not limited to these examples.

The control die 608 has a number of bond pads 674a, 674b on a first major surface 684 of control die 608. There may be "n" bond pads 674a, to deliver voltages from a corresponding "n" word line drivers 660(1)-660(n) to memory die 610. There may be one bond pad 674b for each bit line associated with plane 620. The reference numeral 674 will be used to refer in general to bond pads on major surface 682. Note that there may be bond pad pairs 670a/ 674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 610 to the control die 608.

Also, the bond pads 670, 674 permit internal signal transfer between the memory die 610 and the control die 608. Thus, the memory die 610 and the control die 608 are bonded together with bond pads. Although FIG. 6A depicts one control die 608 bonded to one memory die 610, in another embodiment one control die 608 is bonded to multiple memory dies 610.

Herein, "internal signal transfer" means signal transfer between the control die 608 and the memory die 610. The internal signal transfer permits the circuitry on the control die 608 to control memory operations in the memory die 610. Therefore, the bond pads 670, 674 may be used for memory operation signal transfer. Herein, "memory operation signal transfer" refers to any signals that pertain to a memory operation in a memory die 610. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum and alloys thereof. There may be a liner between the bond pads 670, 674 and the major surfaces (682, 684). The liner may be formed for example of a titanium/ titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier 350 may be electrically connected to bond pad 674b by pathway 664. Relative to FIG. 6A, the electrical paths 612 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 614 can correspond to the pathway 662, the bond pads 674a, and bond pads 670a. Note that pathways 662 may comprise a separate conductive pathway for each word line driver 660(1)-660(n). Likewise, a there may be a separate bond pad 674a for each word line driver 660(1)-660(n). The word lines in block 2 of the memory die 610 may be electrically connected to bond pads 670a by pathways 664. In FIG. 6B, there are "n" pathways 664, for a corresponding "n" word lines in a block. There may be separate pair of bond pads 670a, 674a for each pathway 664. Relative to FIG. 5, the on-die control circuits of FIG. 6A can also include addition functionalities within its logic elements, both more general capabilities than are typically found in the memory controller 102 and some CPU capabilities, but also application specific features.

In the following, state machine 312 and/or controller 102 (or equivalently functioned circuits), in combination with all or a subset of the other circuits depicted on the control die 608 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

Figure 7A:
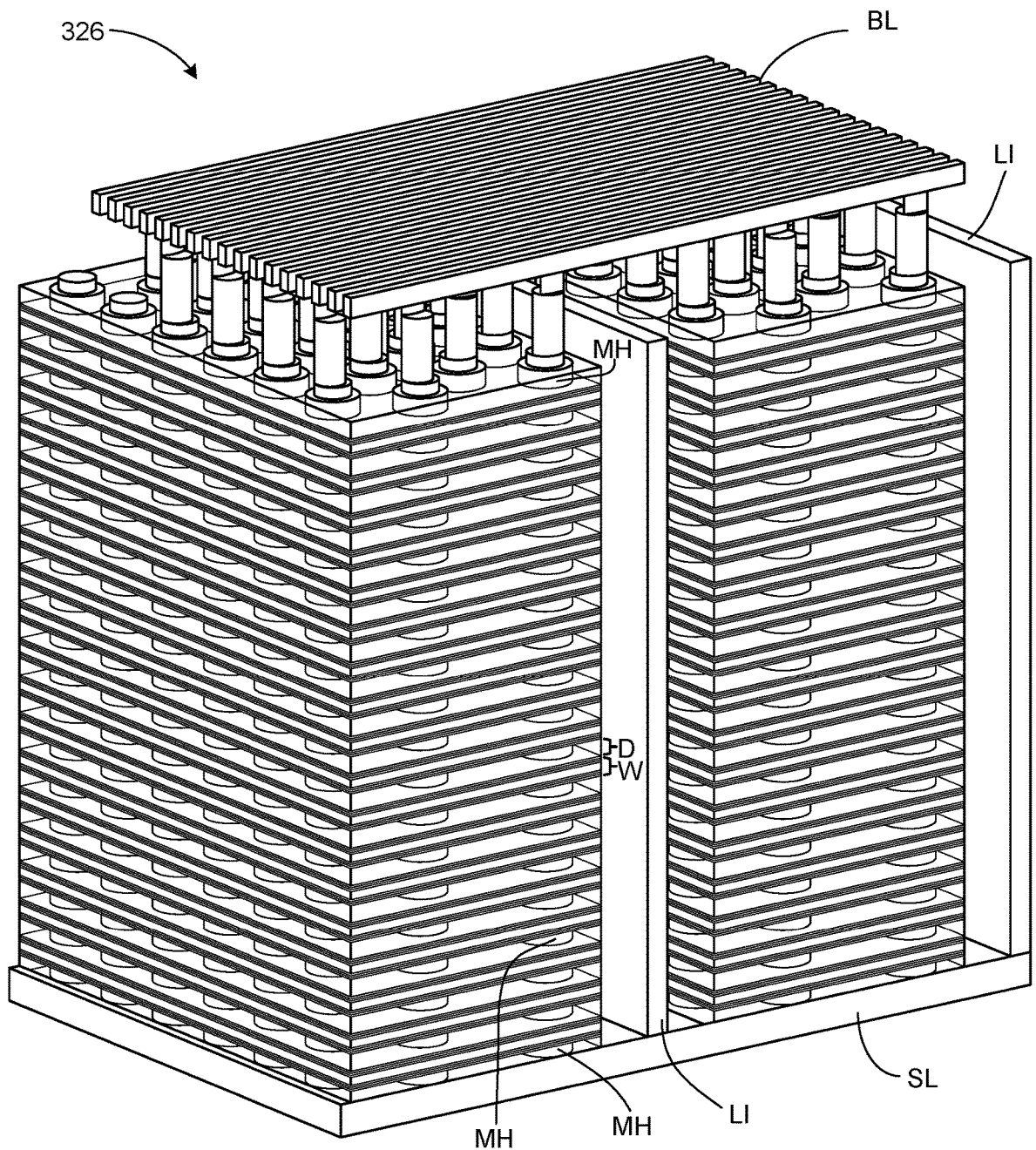
FIG. 7A is a perspective view of a portion of one embodiment of a three dimensional memory structure.

FIG. 7A is a perspective view of a portion of one example embodiment of a three dimensional memory array that can comprise memory structure 326, which includes a plurality non-volatile memory cells. For example, FIG. 7A shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 7A shows two fingers and two local interconnects LI. Below the alternating dielectric layers and word line layers is a source line layer SL. Memory holes are formed in the stack of alternating dielectric layers and conductive layers. For example, one of the memory holes is marked as MEI. Note that in FIG. 7A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells (also referred to as a memory column). Each memory cell can store one or more bits of data. More details of the three dimensional memory array that comprises memory structure 326 is provided below with respect to FIG. 7B-7F.

Figure 7B:
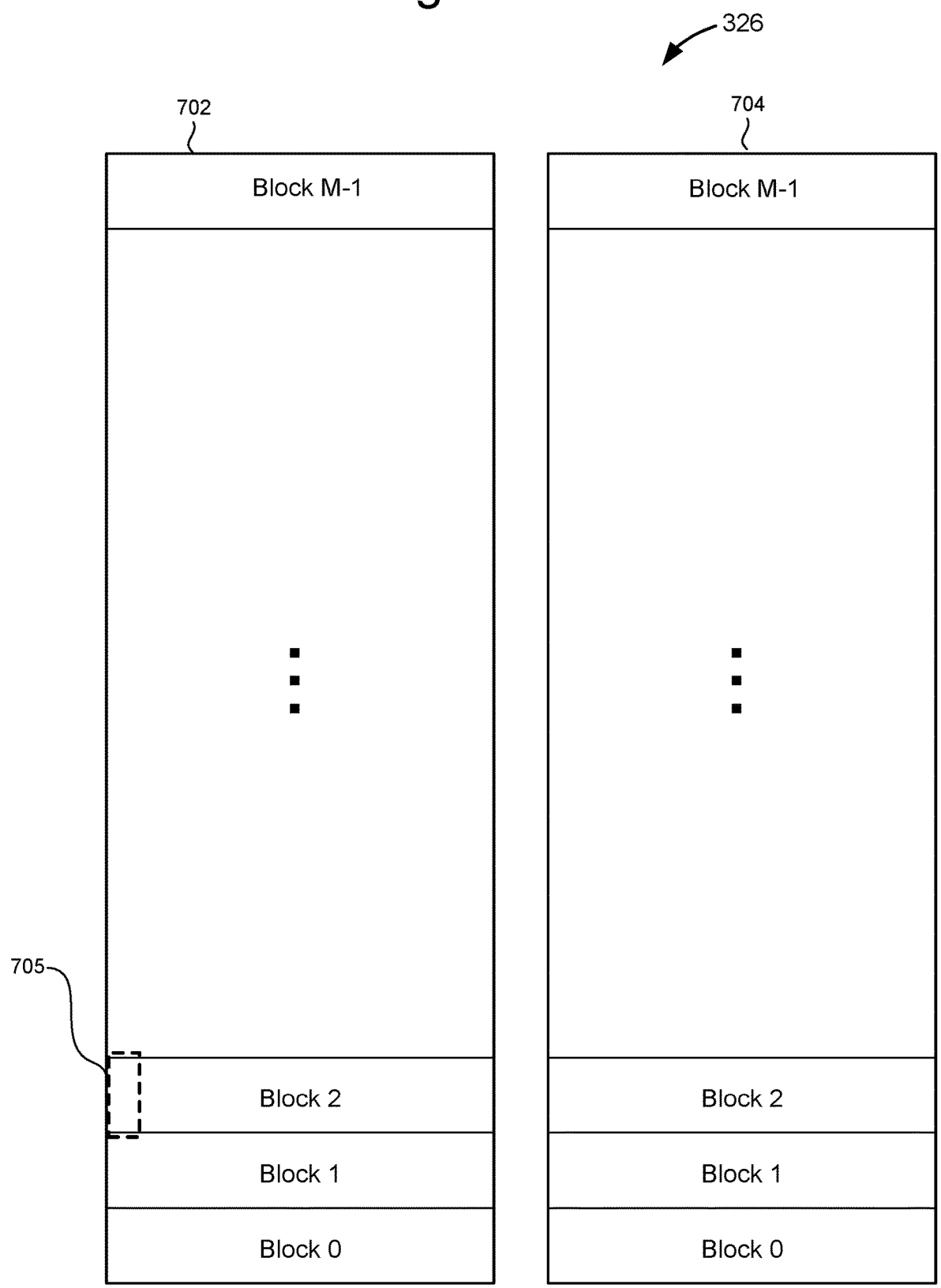
FIG. 7B is a block diagram of a memory structure having two planes.

FIG. 7B is a block diagram explaining one example organization of memory structure 326, which is divided into two planes 702 and 704. Both planes are on the same die (see FIGS. 5-6B). Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Although FIG. 7B shows two planes on the same die, in other embodiments more than two planes can be implemented. For example, the memory structure 326 can include 2-8 (or more) planes. In particular, some of the examples presented below are discussed in the context of a four plane embodiment.

Figure 7C:
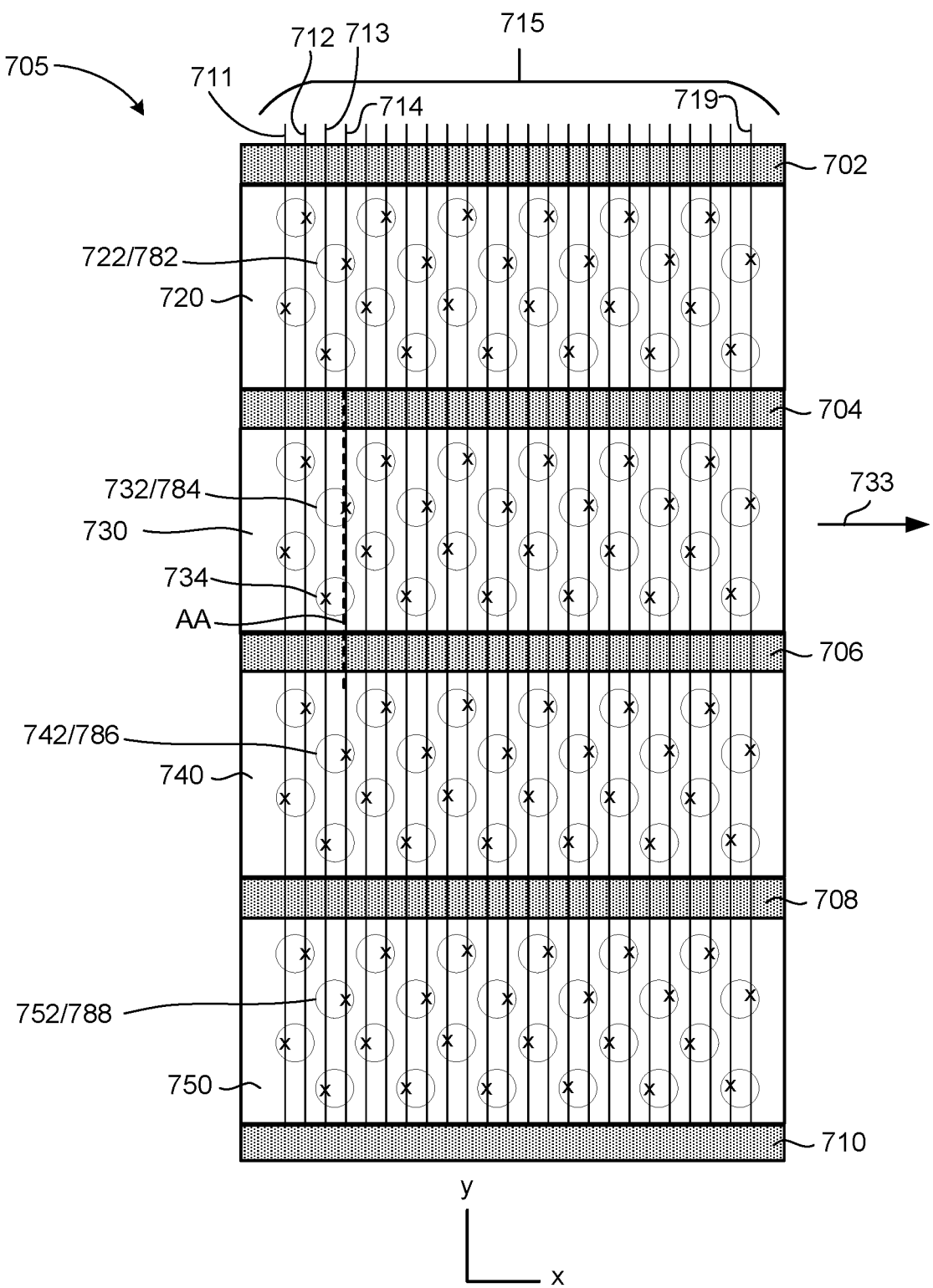
FIG. 7C depicts a top view of a portion of a block of memory cells.

FIGS. 7C-7F depict an example three dimensional ("3D") NAND structure that corresponds to the structure of FIG. 7A. FIG. 7C is a block diagram depicting a top view of a portion of one block from memory structure 326. The portion of the block depicted in FIG. 7C corresponds to portion 705 in block 2 of FIG. 7B. As can be seen from FIG. 7C, the block depicted in FIG. 7C extends in the direction of 732. In one embodiment, the memory array has many layers; however, FIG. 7C only shows the top layer.

FIG. 7C depicts a plurality of circles that represent the vertical columns, which are also referred to as memory columns. Each of the vertical columns include multiple select transistors (also referred to as a select gate or selection gate) and multiple memory cells. In one embodiment, each vertical column implements a NAND string. For example, FIG. 7C depicts vertical columns 722, 732, 742 and 752. Vertical column 722 implements NAND string 782. Vertical column 732 implements NAND string 784. Vertical column 742 implements NAND string 786. Vertical column 752 implements NAND string 788. More details of the vertical columns are provided below. Since the block depicted in FIG. 7C extends in the direction of arrow 730 and in the direction of arrow 733, the block includes more vertical columns than depicted in FIG. 7C.

FIG. 7C also depicts a set of bit lines 715, including bit lines 711, 712, 713, 714, ..., 719. FIG. 7C shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 714 is connected to vertical columns 722, 732, 742 and 752.

The block depicted in FIG. 7C includes a set of local interconnects 702, 704, 706, 708 and 710 that connect the various layers to a source line below the vertical columns. Local interconnects 702, 704, 706, 708 and 710 also serve to divide each layer of the block into four regions; for example, the top layer depicted in FIG. 7C is divided into regions 720, 730, 740 and 750, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 720, 730, 740 and 750. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 7C shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 7C also shows the vertical columns being staggered. In other embodiments, different patterns of staggering can be used. In some embodiments, the vertical columns are not staggered.

Figure 7D:
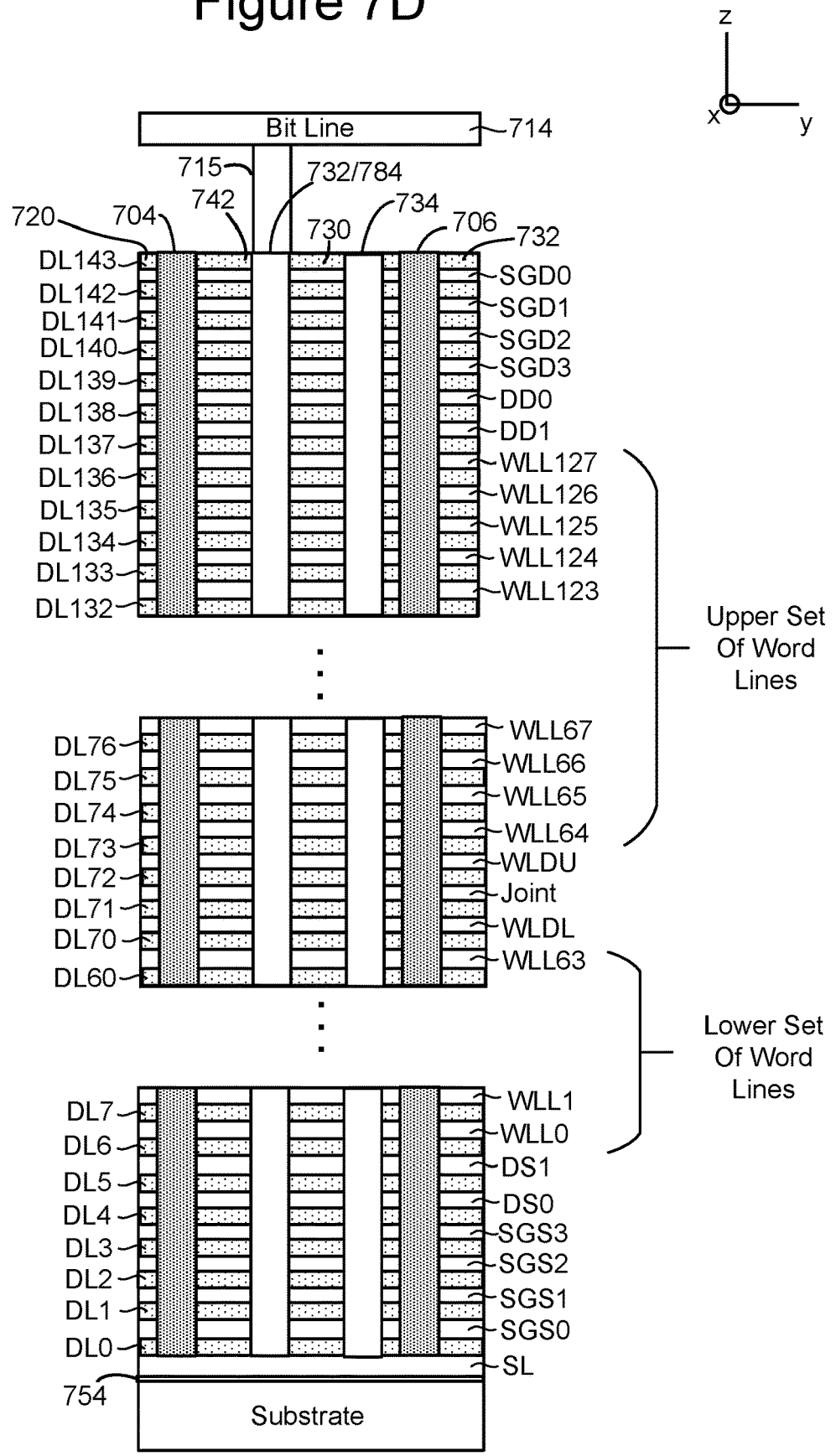
FIG. 7D depicts a cross sectional view of a portion of a block of memory cells.

FIG. 7D depicts a portion of one embodiment of a three dimensional memory structure 326 showing a cross-sectional view along line AA of FIG. 7C. This cross sectional view cuts through vertical columns 732 and 734 and region 730 (see FIG. 7C). The structure of FIG. 7D includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and one hundred and twenty eight data word line layers WLL0-WLL127 for connecting to data memory cells. Other embodiments can implement more or less than four drain side select layers, more or less than four source side select layers, more or less than six dummy word line layers, and more or less than one hundred and twenty eight word lines. Vertical columns 732 and 734 are depicted protruding through the drain side select layers, source side select layers, dummy word line layers and word line layers. In one embodiment, each vertical column comprises a vertical NAND string. For example, vertical column 732 comprises NAND string 784. Below the vertical columns and the layers listed below is substrate, an insulating film 754 on the substrate, and source line SL. The NAND string of vertical column 732 has a source end at a bottom of the stack and a drain end at a top of the stack. As in agreement with FIG. 7C, FIG. 7D show vertical column 732 connected to Bit Line 714 via connector 715. Local interconnects 704 and 706 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-

DL143. For example, dielectric layers DL136 is above word line layer WLL126 and below word line layer WLL127. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 7D also shows a Joint area. In one embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint area, and laying down a second stack of sixty four word line layers alternating with dielectric layers. The Joint area is positioned between the first stack and the second stack. The Joint area is used to connect to the first stack to the second stack. In FIG. 7D, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 7D.

FIG. 7E depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 7D. As mentioned above with respect to FIG. 7C, in one embodiment local interconnects 702, 704, 706, 708 and 710 break up the conductive layers into four regions/fingers. For example, word line layer WLL126 is divided into regions 760, 762, 764 and 766. In one embodiment, the four word line fingers on a same level are connected together. In another embodiment, each word line finger operates as a separate word line.

Drain side select gate layer SGD0 (the top layer) is also divided into regions 720, 730, 740 and 750, also known as fingers or select line fingers. In one embodiment, the four select line fingers on a same level are connected together. In another embodiment, each select line finger operates as a separate word line. The drain side select gates can be used to individually selected one or more of the figures for a memory operation, such as a write or read.

Figure 7F:
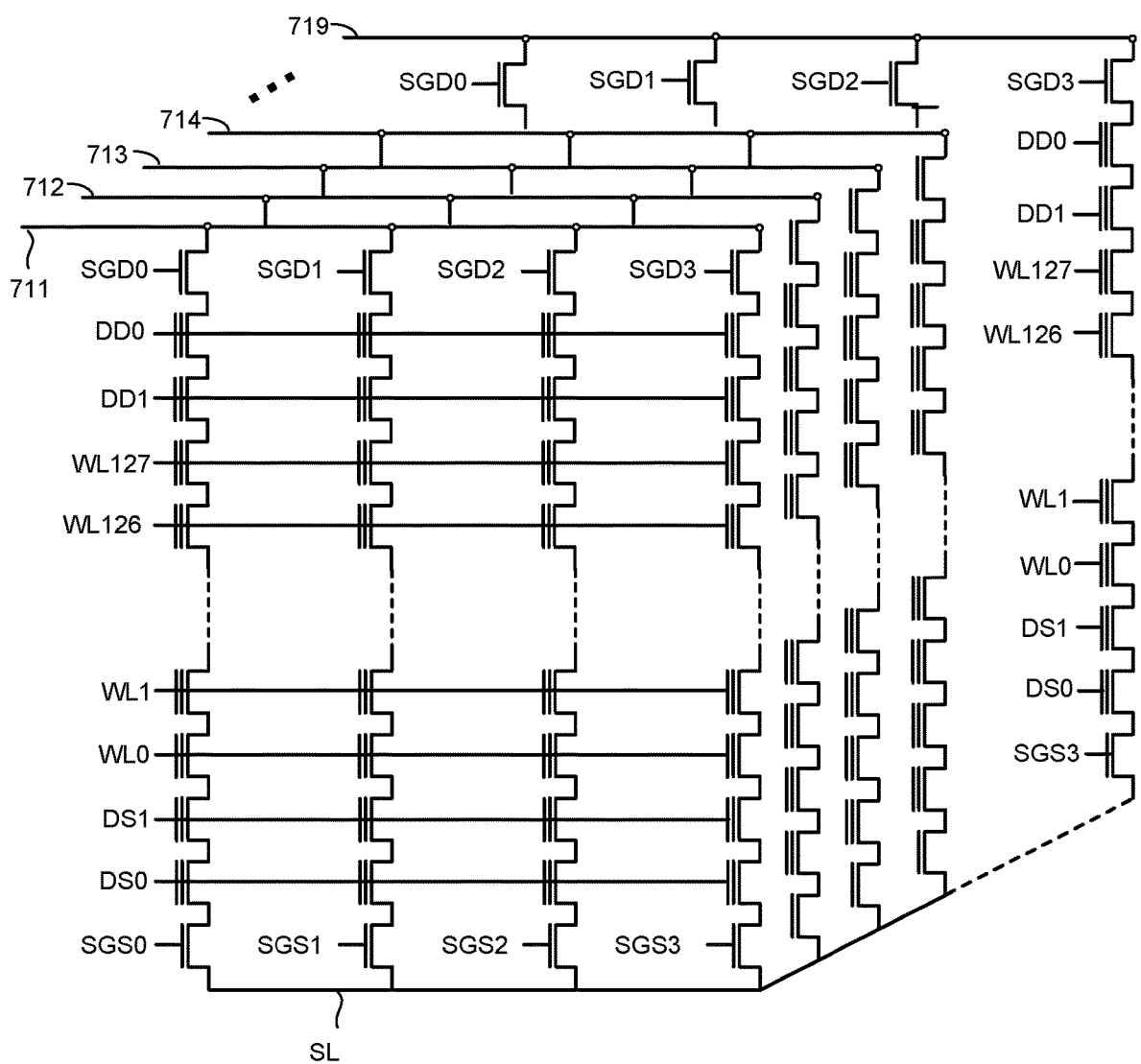
FIG. 7F is a schematic of a plurality of NAND strings.

FIG. 7F is a schematic diagram of a portion of the memory depicted in in FIGS. 3-4E. FIG. 7F shows physical word lines WLL0-WLL127 running across the entire block. The structure of FIG. 7F corresponds to portion 706 in Block 2 of FIGS. 7A-E, including bit lines 711, 712, 713, 714, . . . . 719. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIGS. 7A-7F is a three dimensional memory structure that includes vertical NAND strings with charge-trapping material, other (2D and 3D) memory structures can also be used with the technology described herein.

Figures 8, 9:
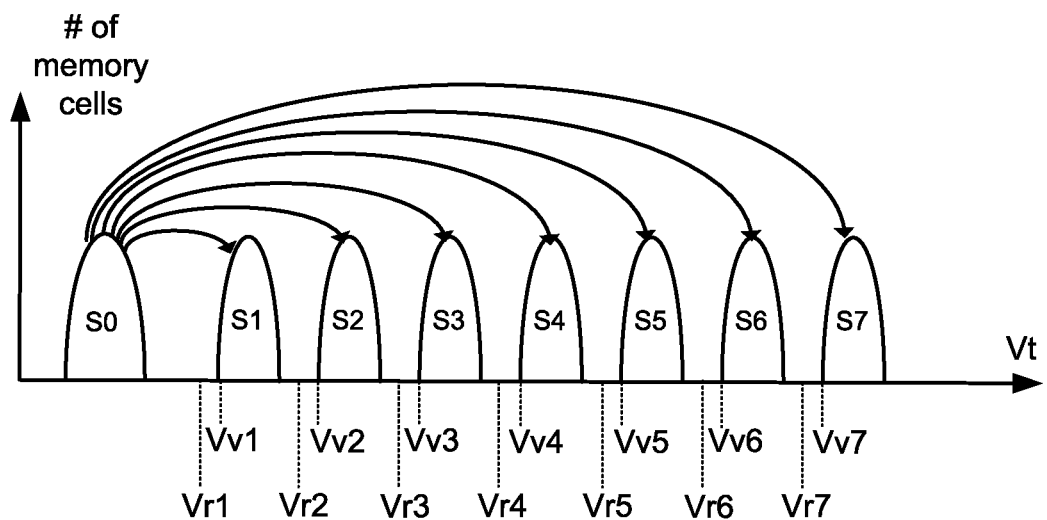
FIG. 8 depicts threshold voltage distributions.
FIG. 9 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory array when each memory cell stores three bits of data. Other embodiments, however, may use other data capacities per memory cell (e.g., such as one, two, four, or five bits of data per memory cell). FIG. 8 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 8 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 8 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 8 represent the full sequence programming. The technology described herein can also be used with other types of programming in addition to full sequence programming (including, but not limited to, multiple stage/phase programming). In some embodiments, data states S1-S7 can overlap, with controller 102 relying on error correction to identify the correct data being stored.

FIG. 9 is a table describing one example of an assignment of data values to data states. In the table of FIG. 9, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 9, all bits stored in a memory cell are 1 when the memory cell is erased (e.g., in data state S0).

Figure 10:
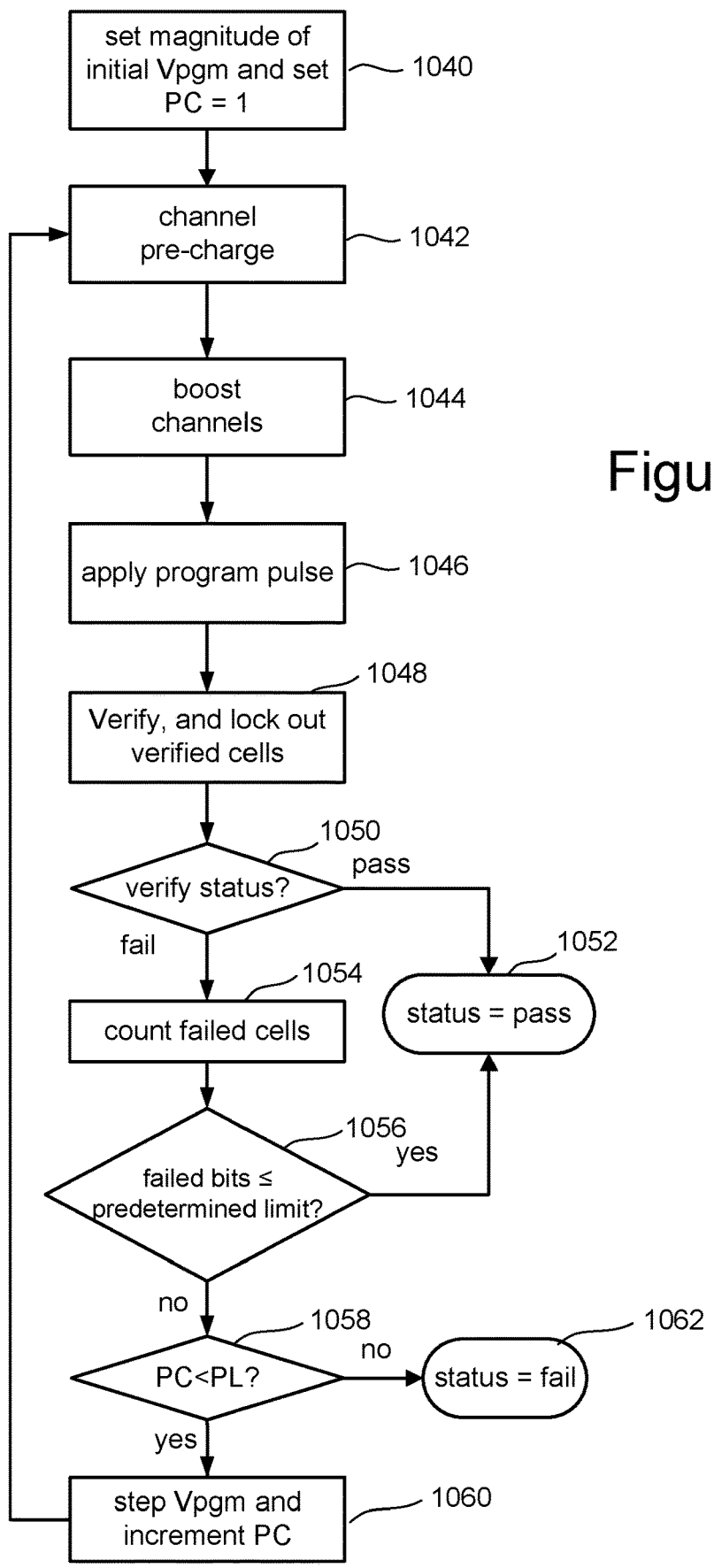
FIG. 10 is a flow chart describing one embodiment of a process for programming non-volatile memory.

FIG. 10 is a flowchart describing one embodiment of a process for programming. In one example embodiment, the process of FIG. 10 is performed on memory die 300 using the control circuit discussed above. For example, the process of FIG. 10 can be performed at the direction of state machine 312. The process of FIG. 10 can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 1040 of FIG. 10, the programming voltage (Vpgm) is initialized to the starting magnitude (e.g., ~12-16V or another suitable level) and a program counter PC maintained by state machine 312 is initialized at 1.

In one embodiment, the group of memory cells in a same block that are selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1042 the memory system will pre-charge channels of NAND strings that include memory cells connected to the selected word line that are to be inhibited from programming. In some embodiments, only the drain side of the channel is pre-charged. By "drain side" it is meant the portion of the NAND string on the same side of the selected word line as the bit line connection.

In step 1044, NAND strings that include memory cells connected to the selected word line that are to be inhibited from programming have their channels boosted to inhibit programming. In one embodiment, the unselected word lines receive one or more boosting voltages (e.g., ~7-11 volts) to perform boosting schemes known in the art.

In step 1046, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to Vdd to inhibit programming. In step 1046, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 1046, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 1048, it is determined whether all the memory cells have reached their target threshold voltages (pass). If so, the programming process is complete and successful because all selected memory cells were programmed and verified to their target states. A status of "PASS" is reported in step 1052. If, in 1050, it is determined that not all of the memory cells have reached their target threshold voltages (fail), then the programming process continues to step 1054.

In step 1054, the memory system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1056, it is determined whether the count from step 1054 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1052. In this situation, enough memory cells programmed correctly such that the few remaining memory cells that have not been completely programmed can be corrected using ECC during the read process. In some embodiments, the predetermined limit used in step 1056 is below the number of bits that can be corrected by error correction codes (ECC) during a read process to allows for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 1058 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 1062. If the program counter PC is less than the program limit value PL, then the process continues at step 1060 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 1060, the process loops back to step 1042 and another program pulse is applied to the selected word line so that another iteration (steps 1042-1060) of the programming process of FIG. 10 is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. That is, other read and verify techniques known in the art can also be used.

To increase parallelism and improve memory performance, multi-plane programming, where two or more planes are programmed at the same time, can be used. For example, one block from a first plane is programmed simultaneously with the programming of a block from a second plane. In one situation, the programming is performed on the same word line in both planes. For example, both planes can be programming word line WL2. In other embodiments, as discussed in more detail below, the system may program different word lines in different planes. For example, the first plane may receive programming for memory cells connected to word line WL2 while the second plane may receive programming for memory cells connected to word line WL3.

Although multi-plane operations can improve performance, they increase the effective size of a memory block by a factor of the number of blocks being operated in parallel. As the number of planes on a die increases, and the size of each of the planes (i.e., more word lines and more fingers in the sort of 3D structure described above with respect to FIGS. 7A-7F) increases, the quantity of data treated as a unit in memory operations increases. Although this increases the amount data that can be stored on a memory system, and increase write speeds, this large block size can clash with the requirements of a host using the memory system. For example, if the size of a logical range of data as used by a host as a basic unit is smaller than the amount of data with which a memory device operates, this mis-alignment can lead to portions of the unit of the memory device's operation being left unused.

The following discussion presents techniques that can allow an SSD drive or other non-volatile storage system to manage open blocks in a plane-block (i.e., a block of a single plane) granularity and write different plane-blocks of the same die at different word lines at the same performance level as when writing the entire die-block (i.e., a block in each of planes) in parallel. A particular example discussed below is of a use case for "Zoned Namespace Storage", or ZNS.

Zoned Storage is a storage arrangement motivated by the explosion of data. Large scale data infrastructures can utilize tens of thousands of hard disk drives (HDDs) and SSDs. Hyperscale companies need to be able to carefully manage them from a global perspective in a cost-effective way.

Zoned Block Device technologies were introduced with the goal of moving towards efficient data management in large-scale infrastructure deployments. Zoned Storage Devices (ZSDs) are block storage devices that have their address space divided into zones. In a common arrangement, ZSDs impose unconventional writing rules: zones can only be written sequentially and starting from the beginning of the zone. In addition, data within a zone cannot be arbitrarily overwritten.

Figure 11:
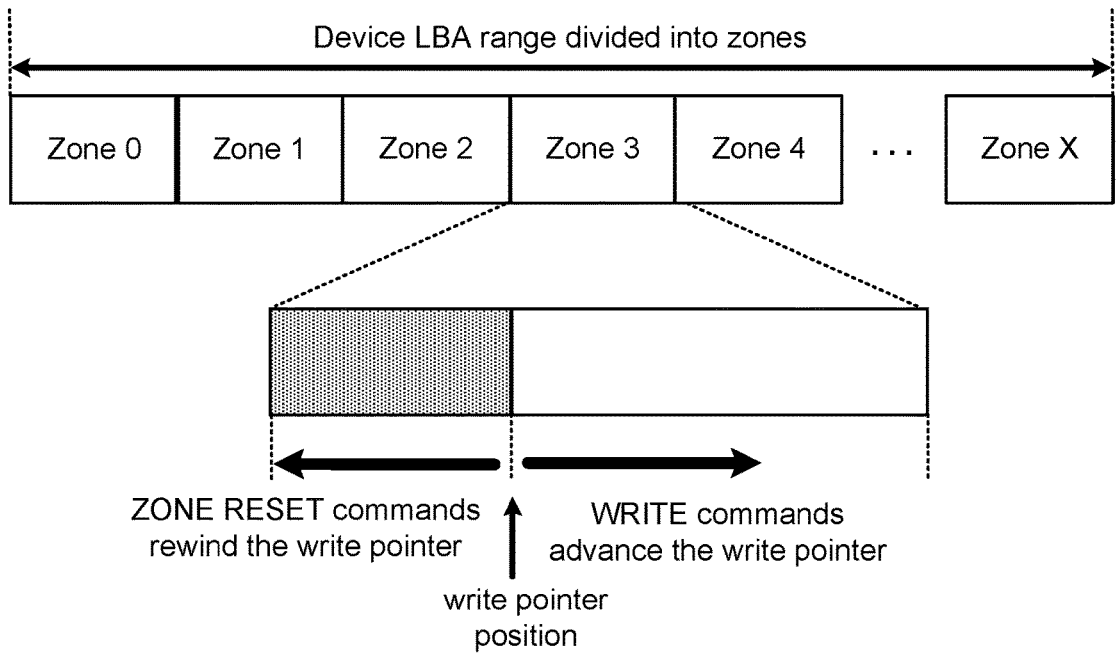
FIG. 11 illustrates a division of a device's logical block address (LBA) range into zones.

FIG. 11 illustrates a division of a device's logical block address (LBA) range into zones. As illustrated in FIG. 11, a range of LBAs for host data is divided up into (X+1) zones, where data is stored based upon zones and a zone contains a set amount of data. As illustrated in the detail of the expanded zone, writes of data within a zoned namespace are based upon a write position pointer, with each zones having an independent write pointer, such as illustrated in the detail of FIG. 11. Write commands advance the write pointer and a zone reset command rewinds the zone's pointer.

Under a standard ZNS implementation, the only way to overwrite an already written zone is to reset the zone write pointer, effectively deleting all the data in the zone, and to restart writing from the beginning of the zone. Reading data, on the other hand, is largely unrestricted and the data can be read in the same manner as on traditional storage devices. In the following discussion, a zone can be thought of as a range of data that an application can write to.

To increase storage capacities, NAND and other block based memories continue to scale bigger and bigger block sizes. For example, referring back to the structures of FIGS. 7A-7F, this corresponds to increasing one or more of the number of word lines, fingers, and planes on a memory die to be able to store more into a block and increase performance. For example, the number of word lines may increase to well over 100, the number of fingers can increase to five or more, the number of planes to four or more. For example, with four planes per die, five fingers per plane, and 160 word lines, the resultant block size increases to 200 MB.

For many servers and other hosts that use zone based storage, there is typically a requirement that zone capacity will not exceed a specified size, and often a preference for smaller zones sizes. (For example, in a Microsoft based ZNS, zone capacity is specified to not exceed 128 MB.) For earlier designs with zone capacities on the order of 48 MB, this can align with the die block size of a memory device and programming zones in a dual plane mode can optimize performance per zone. However, for memory devices having a memory die block size greater than the zone capacity for host data, this would mean that a single zone of host data will not fill out a given die-block (i.e., a block will all planes operated together) on a memory die if all planes are operated in parallel. To address this, the following presents techniques where subsets of the planes on a die are assigned to zones, allocating a subset of the planes (such as one plane per block (a "plane-block") or two planes per block, for example) to a zone in order to meet zone size requirements, with the result that different zones will share the same die-block.

Figure 12:
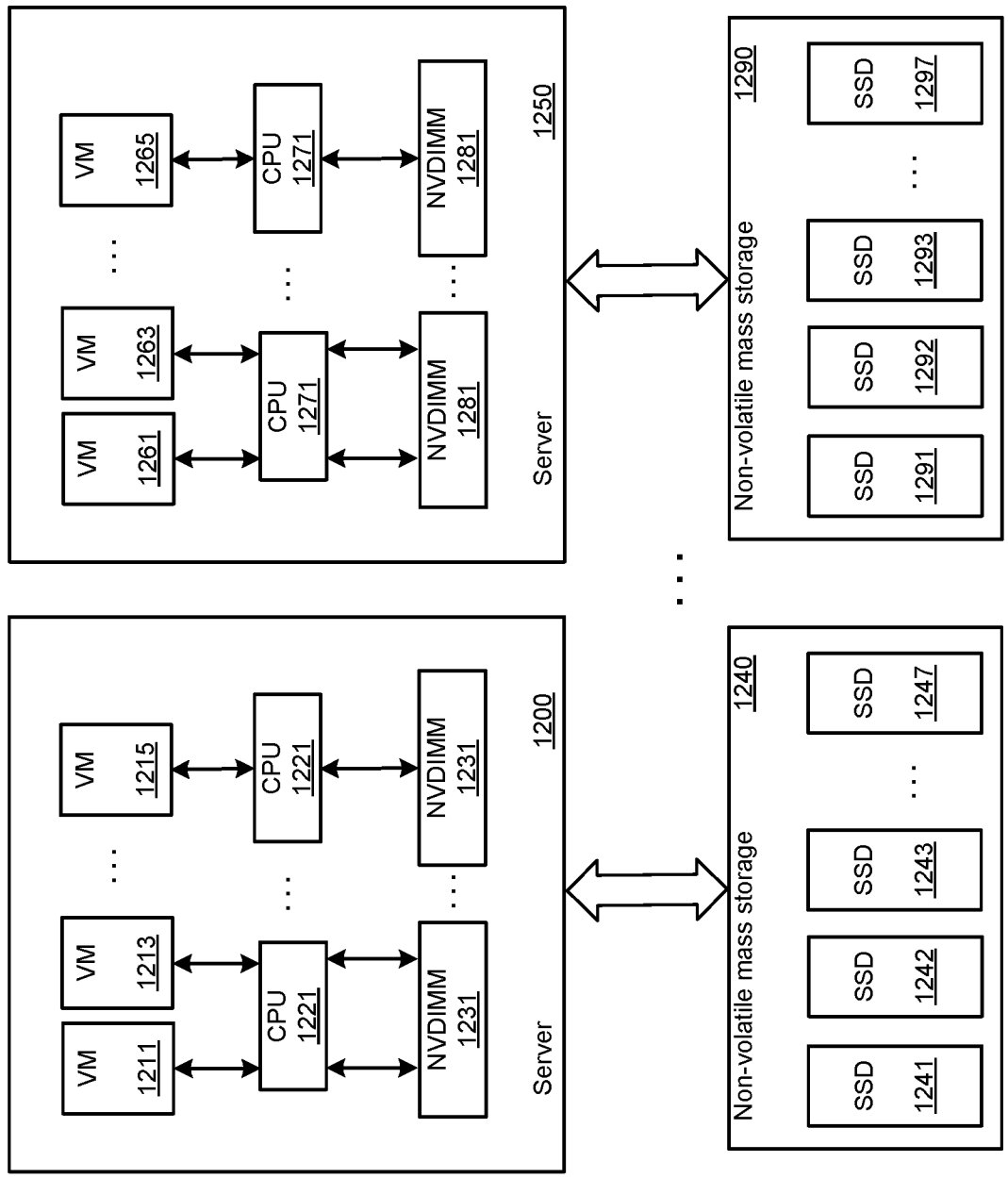
FIG. 12 is a high-level block diagram of an embodiment of a server architecture.

FIG. 12 is a high-level block diagram of an embodiment of a server architecture. Two servers 1200 and 1250 are shown, each with a number of virtual machines (1211, 1213, . . . , 1215 and 1261, 1263, . . . , 1265, respectively) running on the servers' CPUs (1221, . . . , 1223 and 1271, . . . , 1273, respectively). The other shown components for each server 1200 and 1250 in this simplified representation are a set of non-volatile dual in-line memory modules NVDIMMs 1231, . . . , 1233 and 1281, . . . , 1283, respectively. Within these NVDIMMs, the servers will store data in a ZNS format. Each of the servers 1200, 1250 will store host data in a non-volatile mass store 1240, 1290, respectively, each of which can be made up of a number SSD enclosures 1241-1247, 1291-1297. Each of the SSDs can be structured as described above with respect FIG. 1-4 based on non-volatile memory die as described above with respect to FIGS. 5-10.

As the hosts (i.e., servers 1200, 1250) store data in a zone based format and operates each zone independently, the host preferably can write to these zones on the memory die of the SSDs in an asynchronous manner because the concept of ZNS drives allows the host to allocate a zone per virtual machine/application and the application can exclusively write to this zone. Consequently, for performance purposes this can be a problem if the structure of the non-volatile memory making up the SSDs does not allow this.

In a typical dual- or multi-plane memory die architecture, programming is performed such that the dual (or multi-) plane operation happens in a way that the word line/finger number across the planes remains the same: i.e., if the system tries to program Planet) and Planet of a given die block, it can only do so by programming the same string and word line across both planes to maintain performance. If the system needs to program a different word line and string in different planes, then it would do so in single plane mode, thus sacrificing performance.

One approach to address this mis-alignment between zone size on the host and die-block size on the memory would be to increase the zone size, but having a smaller zone size can have advantages for a host. For example, in the Microsoft server architecture, the zone size is not to exceed is 128 MB. This is related to the way in which Microsoft stores data in its "extent nodes". Extent nodes are simply the replica of the data, similar to a RAID (Redundant Array of Independent Disks) arrangement. The zones which are frequently written, or "hot", will be replicated thrice, i.e., three copies of the zone will be created and it will be written to SSDs belonging to different enclosures. The aggregation of the data at the extent node is typically done in 1 GB-3 GB data lengths. Thus, when the zone data fills out an extent, it may not align to the extent boundary and there may be some space left at the end, which will result in over-provisioning (OP) loss. This is represented schematically in FIG. 13.

Figure 13:
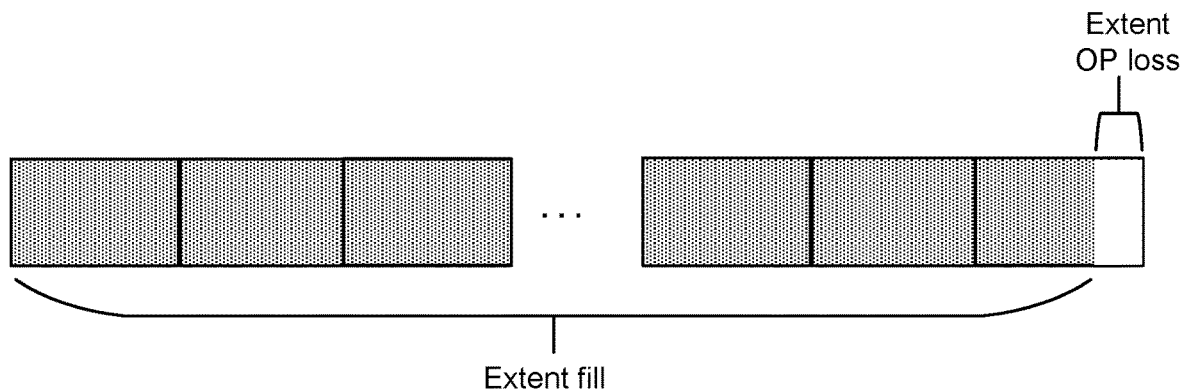
FIG. 13 is a schematic representation of the over-provisioning loss at the end of the extent for zone based data.

FIG. 13 is a schematic representation of the over-provisioning loss at the end of the extent. As illustrated in FIG. 13, a extent is filled with data from a number of zones. The size of the extent does not correspond to an integer number of zones, so that there is some extent OP loss, where the size of the loss can be up to an amount of data that is less than the size of a zone. If the zones are bigger, this OP loss will be greater. Thus, for this and similar sorts of arrangements, smaller zones make sense. Additional, even if the maximum zone size were redefined upward, as block sizes on memory die also continue to increase, the mismatch between zone size and block size would be a recurring problem.

The following discussion will be based on an embodiment in which a memory die has four planes, each plane has five fingers, and a plane can accommodate 50 MB. Other embodiments can have different numbers of planes and fingers and different capacities, but this example can be used to illustrate the zone programming scheme presented here. In a four plane embodiment, 4 zones can be accommodated in a single die block, each using a different plane-block, and zone capacity will be 50 MB. Alternatively, 2 zones can share the same die-block, each spanning 2 plane-blocks, with a zone-capacity of 100 MB each. The memory architecture supports programming different word lines and different strings within each of the planes.

Figure 14:
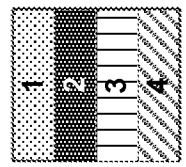
FIG. 14 illustrates an embodiment of a multi-plane programming scheme to service different zones while maintaining memory performance.

FIG. 14 illustrates an embodiment of a multi-plane programming scheme to service different zones while maintaining memory performance. In this embodiment, the memory die has four planes (Plane 0, Plane 1, Plane 2, Plane 3), which can be NAND memory as described above with respect to FIGS. 5-10 or other block based memory. Using the example of a 3D NAND memory structure, the memory cells of each plane are arranged into fingers, with each plane having five fingers in this example. More generally, these can represent other sub-block or sub-plane level structures that can be independently selectable for programming. In the embodiment of FIG. 14, a first zone (Zone A) is assigned to Plane 0 and Plane 1 and a second zone (Zone B) is assigned to Plane 2 and Plane 3.

FIG. 14 represents the memory die after a sequence of four different examples of write operations. In a first write operation, only Zone A data is programmed, starting at the initial point on word line WL0 and across all five fingers of both Plane 0 and Plane 1. In this first write operation, no Zone B data is written and all of word line WL0 is used in planes Plane 0 and Plane 1, which are written in parallel. In a second write operation, data is concurrently written for both Zone A and Zone B, but to different word lines, with Zone A data being written to all fingers of Plane 0 and Plane 1 along word line WL1 and Zone B data being written to all fingers of Plane 2 and Plane 3 along word line WL0. In a third write operation, only Zone B data is written and only to a partial plane of fingers 0 and 1 of Plane 2 along word line WL1. In a fourth write operation, data is concurrently written to both zones, but at different word lines and different sets of fingers: in a parallel write operation, Zone B data is written to fingers 2-4 of Plane 2 and all of Plane 3 along word line WL1, and Zone A data is written into all of Plane 0 and fingers 1-2 of Plane 1 along WL 2.

When host data is written to only to one of the zones, only the relevant planes will be programmed, as in the first program operation of FIG. 14. When host data is being written to both zones in parallel, one or more control circuits of the memory apparatus can aggregate data for both zones and generate the write operations for both zones in parallel, but with different word line/finger locations, as illustrated in the second program operation where different word line addresses can be provided as part of multiplane programing, where write and program are being used interchangeably in this discussion. The third program operation of FIG. 14 illustrates programming of Zone B only, but for only two fingers. The fourth program operation of FIG. 14 illustrates the case where different finger addresses can be provided as part of multiplane program. Thus, with the arrangement of FIG. 14, the memory system can still maintain multi-plane (here, 4-plane) performance while achieving smaller zone size.

The embodiment of FIG. 14 illustrates an embodiment in which multiple zones can be assigned to a single die, and where each of the zones is assigned to multiple planes (two planes each). More generally, embodiments can include a die storing data from multiple zones, each of the zones being assigned to one or more planes, where different ones of these zones could be assigned to different numbers of planes. For example, referring back to FIG. 14, Zone A could still be assigned to Plane 0 and Plane 1, but Plane 2 could be assigned to Zone B and Plane 3 assigned to a Zone C. A host or memory controller could use this approach if, for example, Zone A is "hotter" than Zones B and C. This arrangement allows for the memory system to keep zone size small, thereby reducing overprovisioning loss at the extent layer, while maintaining performance even with multiple zones across a single die block.

Figure 15:
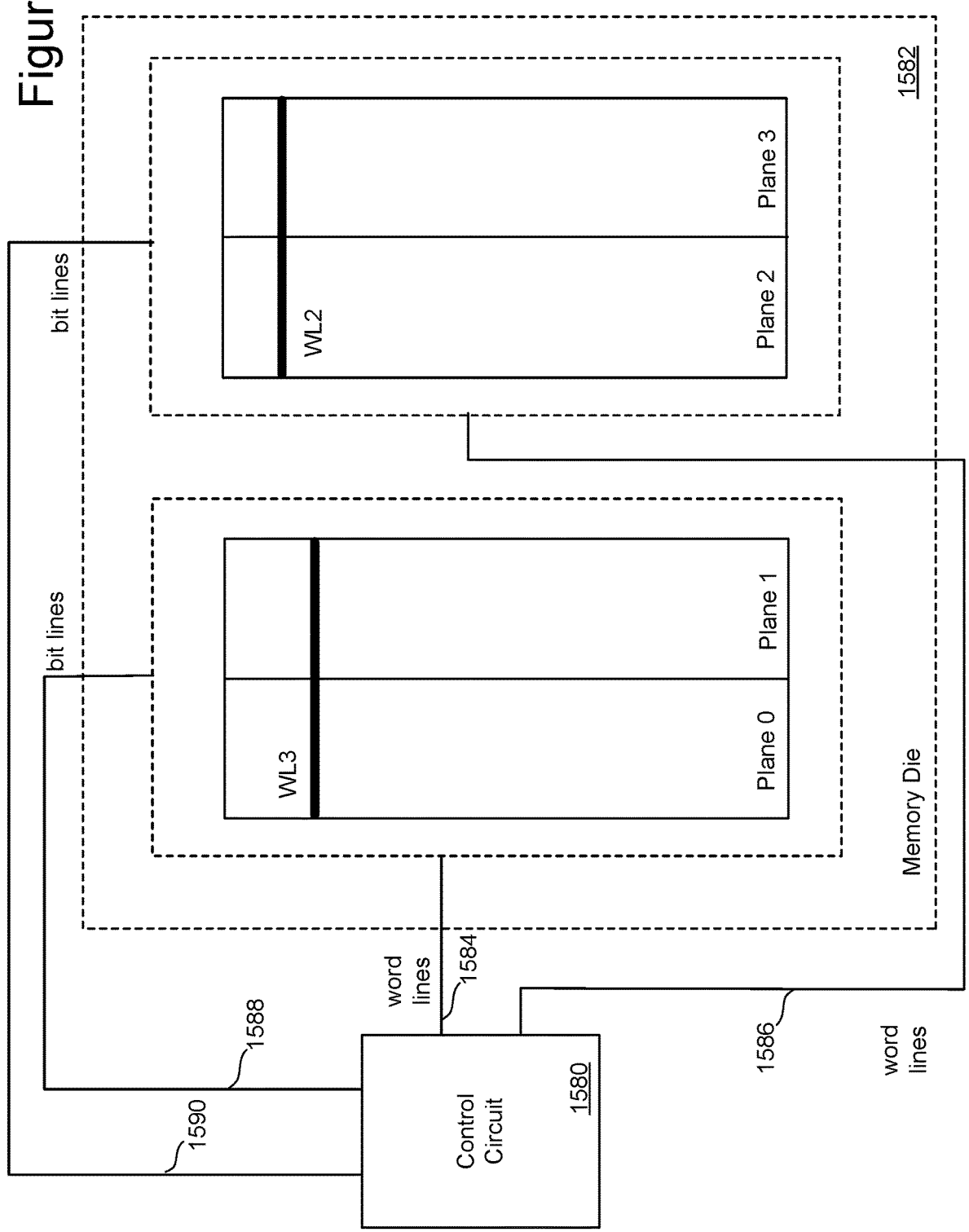
FIG. 15 is a block diagram depicting portions of a memory system that simultaneously programs memory cells connected to different word lines that are in different planes of a die.

FIG. 15 depicts a control circuit 1580 connected to a memory structure 1582 that includes four planes: Plane 0, Plane 1, Plane 2 and Plane 3. In one embodiment, memory structure 1582 is the memory structure 326 of FIG. 5 or 6A. Each of Planes 0-3 can have many blocks, and each block has a number of fingers (five in the embodiment of FIG. 14) that can be considered sub-blocks in that they can be individually selected. Word lines 1584 connect from control circuit 1580 to Plane 0 and Plane 1. Word lines 1586 connect from control circuit 1580 to Plane 2 and Plane 3. Bit lines 1588 connect from control circuit 1580 to Plane 0 and Plane 1. Bit lines 1590 connect from control circuit 1580 to Block 2 and Block 3. In one embodiment, control circuit 1580 includes control circuitry 310, read/write circuits 328 and decoders 324/332 described above with respect to FIGS. 5 and 6A. In other embodiments, other circuits that support and operate on memory structure 326 can be used as the control circuit. For example, in some embodiments, the controller can operate as the control circuit 1580 or can be part of a memory control circuit 102. Control circuit 1580 can also be implemented as a microprocessor, microcontroller or other type of processor that is hardwired or programmed to perform the functions described herein.

In the example of FIG. 15, the control circuit 1580 is configured to simultaneously program memory cells connected to different word lines that are in different fingers, or sub-blocks, of different blocks in different planes of a die. For example, FIG. 15 shows the simultaneous programming Zone A data to memory cells connected to word line WL3 of Plane 0 and Plane 1 and Zone B data to memory cells connected word line WL2 of Plane 2 and Plane 3. Within each of these planes, the fingers of each plane can also be individually selected. The ability to independently erase, read and program such fingers, or sub-blocks, allows for more efficient use of the memory system's storage capacity.

When programming memory cells to different word lines that are in different fingers of different blocks in different planes of a die, each of the word lines needs to receive a programming voltage Vpgm. Because the word lines are in different sub-blocks of different blocks (and are likely to be at different word line positions), it is likely that one of the word lines will program faster than the other word line due to the different word line positions.

Figure 16:
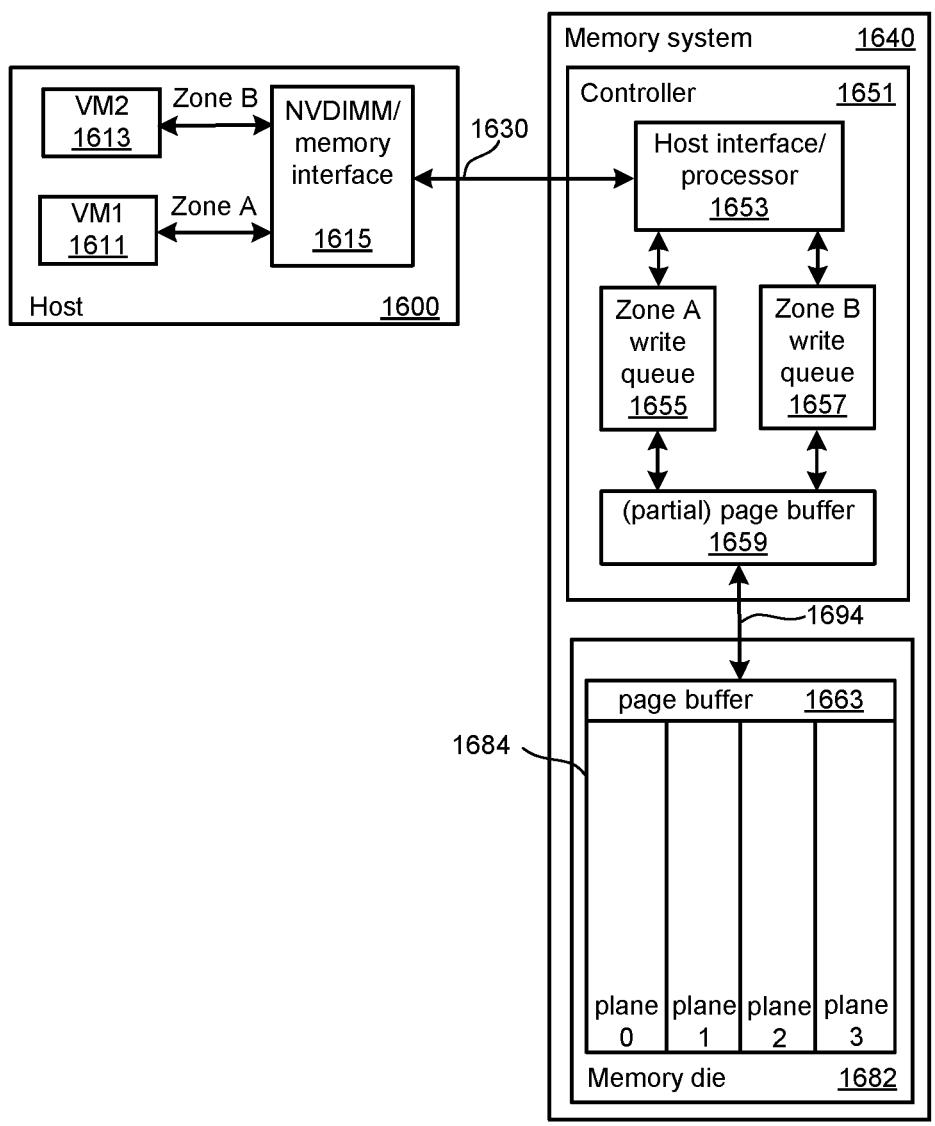
FIG. 16 is a block diagram illustrating the transfer of different zones of data from a host to a memory system, where data for the zones are aggregated on the controller and transferred to a memory die for writing into the planes of the memory die.

FIG. 16 is a block diagram illustrating the transfer of different zones of data from a host to a memory system, where data for the zones is aggregated on the controller and transferred to a memory die for writing into the planes of the memory die. More specifically, FIG. 16 shows a host 1600 and a memory system 1640 in simplified form to focus on the elements of these devices involved in the plane programing scheme for writing zone based data described with respect to FIG. 14. On the host 1600 two virtual machines VM1 1611 and VM2 1613 are running, where the host 1600 has assigned Zone A for data from VM1 1611 and Zone B for data from VM2 1613. To transfer data from Zone A and Zone B to the memory system 1640, data from Zone A and Zone B goes through block 1615, which can represent both the NVDIMM, such as 1231 for FIG. 12, and a memory interface, such as interface 126 of FIG. 1, with the data then transferred over the bus 1630, that can correspond to bus 130 of FIG. 1.

The memory system 1640 includes a memory controller 1651 and a memory die 1682. The memory die 1682 can be one of many memory die on the memory system 1640, such as described above with respect to FIG. 4, with each die having one or more arrays, such as array 1684. The memory die 1682 can be a single die for both the memory array and control circuitry as described above with respect to FIG. 5 or a bonded die pair of a memory die (on which the array is formed) and a control circuitry die, as described above with respect to FIGS. 6A and 6B. The memory controller 1651 and memory die 1682 are connected by a memory bus 1694.

In the simplified representation of the memory controller 1651 of FIG. 16, the memory controller includes a host interface/processor 1653, that can correspond to the interface to host 150 and processing elements in FIGS. 2 and 3, such as processors 152, 220/250, and other memory controller elements. The host interface/processor 1653 stores the Zone A and Zone B data in different queues, a Zone A write queue 1655 and a Zone B write queue 1657. For example, in the more detailed representation of FIG. 3 these queues can be held in the buffer 232/262. The Zone A write queue 1655 can be used to aggregate Zone A data as it comes in from the host 1600 and the Zone B write queue 1657 can be used to aggregate Zone B data as it comes in from the host 1600. For writing the Zone A and Zone B data into the memory array 1684 of the memory die 1682, the controller 1651 combines the data from Zone A and Zone B to be written concurrently into a page of data, or, if the combined data to be written from each of Zone A and Zone B is less than a full page, a partial page of data. For example, in the examples of writes given in FIG. 14, only the second write is a full page of data spanning all fingers of all four planes, albeit on different word lines. To write the Zone A and Zone B data from queues 1655 and 1657 into the memory die 1682, the data can be formed into pages or partial pages in the buffer 1659, that in some embodiments can correspond to the buffers 228/258. Once the pages, or partial pages, of data are assembled, the data is transmitted over the memory bus 1694 along with the assigned physical addresses.

On the memory die 1682, the (partial or full) pages of data can be stored in a write, or page, buffer 1663. The write buffer 1663 is used to hold the data to be programmed into the memory array and is commonly referred to as a page buffer, where this terminology is used in the following discussion, but it will be understood that in partial page writes (i.e., where less than all of the bit lines, fingers, and/or planes are written), the page buffer will hold less than a full page of data. The page buffer 1663 is used to hold a page, or partial page, of data to be written concurrently into the array. The page buffer 1663 can be included within the read/write circuits 328 of FIGS. 5 and 6A. The page of data to be written can be binary or multi-state data and can be used to bias the bits lines of the array 1684 to either a program enable or program inhibit state based upon the data in the page buffer. If a partial page is being written, as in the first, third, and fourth write examples of FIG. 14, the bit lines without data to be written can be program inhibited. If all of a plane does not have any data in a partial page (such as Plane 2 and Plane 3 in the first write of FIG. 14), a programming waveform does not need to be applied to the word lines in the plane.

Returning back to FIG. 15, this shows an embodiment of four planes, with two planes assigned to a zone and where the word lines in the pair of planes assigned to each zone can be commonly decoded and biased, as shown in FIG. 15. In other embodiments, the word lines of each plane can be individually biased so that, if for example, data is only written to one of the planes (e.g., only Plane 2 in write 3 of FIG. 14), the word lines of the other plane or planes assigned to the zone need not receive the programming pulse. With respect to the control circuit 1580, as noted above, this can include elements described in more detail with respect to FIGS. 5 and 6A. This can include the one or more control circuits included in the row decode circuits 324, read/write circuits 328, column decoder 332, and the on-die control circuits 310. For example, the programming operations can be monitored by the state machine 312 and proceed as discussed above with respect to FIGS. 8-10. Depending on the embodiment, the control circuitry elements can be on the same die 1582 as the memory array, on a separate die (where this can be the control 608 of the bonded die pair of FIGS. 6A and 6B), of some combination of these. For example, in a bonded die pair embodiment, control circuit 1580 can be on the control die, as can the page buffer 1663. Additionally, is some embodiments, some or all of the elements described as being part of the memory controller 1651 can be moved onto the memory circuit, particularly in the case of a bonded die pair, where the additional area available relative to the single memory die embodiment of FIG. 5 can be used to add additional functionalities, such as incorporating buffers that can be used to implement the write queues 1655 and 1657.

Figure 17:
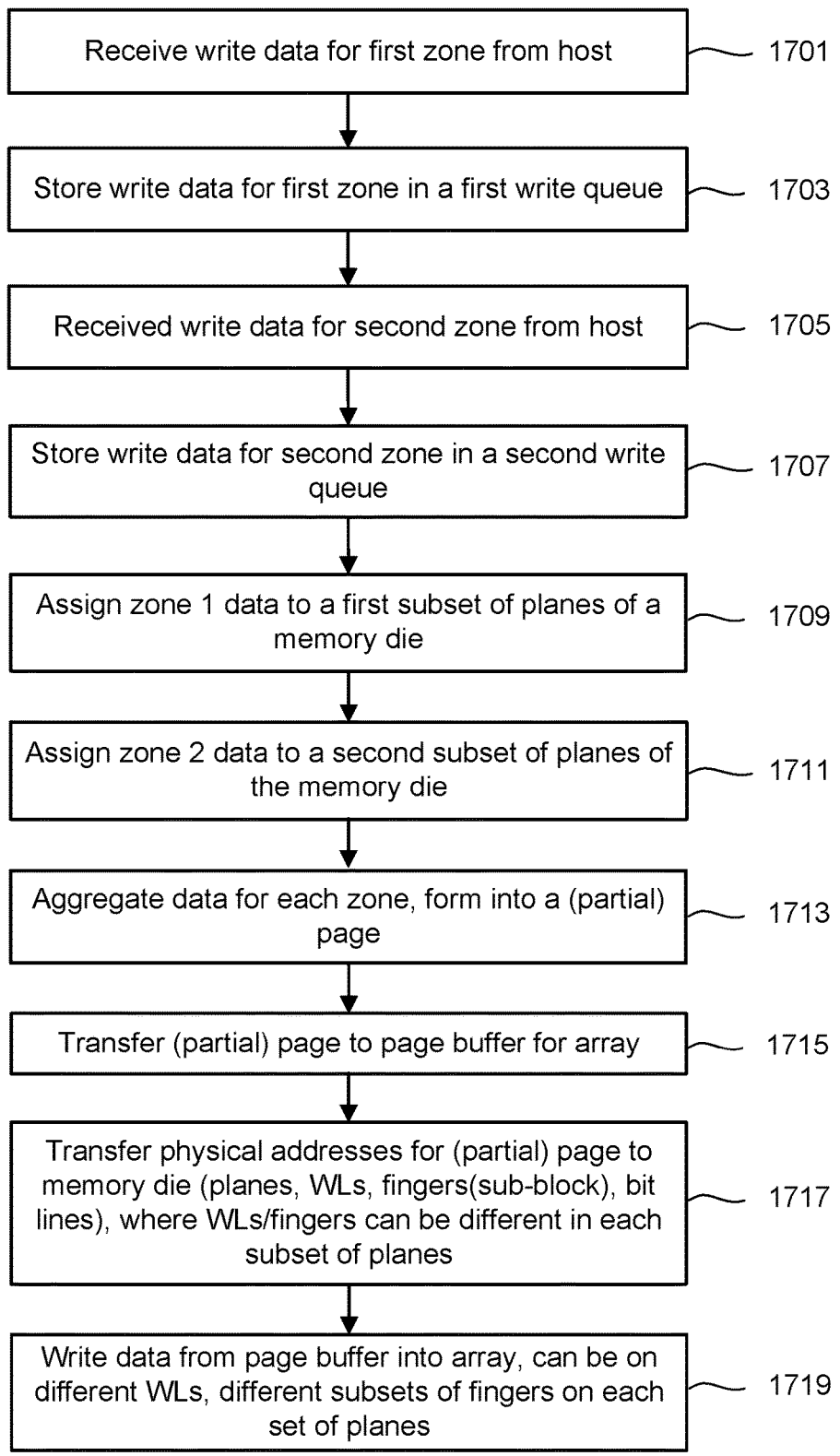
FIG. 17 is a flowchart of an embodiment for a programming scheme for zone based data in which data from different zones is assigned and written to different subsets of planes in a memory array.

FIG. 17 is a flowchart of an embodiment for a programming scheme for zone based data in which data from different zones are assigned and written to different subsets of planes in a memory array. Beginning at step 1701, data for a first zone is received from a host. For example, referring to FIG. 16 this can be Zone A data from virtual machine VM1 1611 running on host 1600 that is transferred to the memory controller 1651 for the memory system 1640. The data for the first zone can then be stored in a corresponding write queue, such as Zone A write queue 1655, in step 1703. Similarly, in order to write data for a second zone, such as Zone B data from virtual machine VM2 1613, is received at step 1705 and stored in a corresponding write queue for Zone B data, such as 1657, at step 1707. At step 1709 the controller 1651 (or other control circuit) assigns the zone 1 write data to a first sub-set of planes for a memory array, and at step 1711 the zone 2 write data for the second zone can be assigned to a section subset of planes with the same array as the subset of zones assigned at step 1709.

Although FIG. 17 presents these steps in a particular order, it will be understood that steps 1701/1703 can be occurring at the same time as steps 1705/1707. Typically, steps 1701/1703 and 1705/1707 are ongoing and overlapping processes and VM1 1611 and VM2 1613 operate and the host 1600 makes determinations as to when data from their corresponding zones need to be stored into non-volatile memory such as an SSD. Similarly, steps 1709 and 1711 can be performed at any convenient time prior to the data being sent to the non-volatile memory for storage. The assignment of data from different zones to share planes of the same array can be done by the controller 1651 based on factors such as when the data shows up, amounts of data involved, or other factors. These zones can be unrelated and assigned to different planes of the same array based on the controller's convenience or, in some embodiments, the host 1600 may determine that the data from the different zones should be associated and stored on the same array if, for example, VM1 1611 and VM2 1613 are working together to some degree or if both zones of data are from the same virtual machine.

As the data from the first and second zones come in, at step 1713 the controller 1651 can aggregate the data for each zone in the corresponding write queue 1655 and 1657, from which it can form the data into pages or partial pages of data to be written into the array 1684. As described with respect to the examples of FIG. 14 and FIG. 15, the data for the different zones can be of less than all of the plane, less than all of fingers (or sub-blocks) for each of the planes, and along different word lines within each of the subsets of the planes. At step 1715 the page, or partial page, of write data is transferred to the page buffer 1663 and the physical addresses for writing the data is transferred at step 1717. For example, the physical addresses for the page or partial page of data can specify: planes to be written, where less than all of the planes can be written; the word lines within each of the subsets of planes to be written, where different subsets can concurrently be written to different word lines within each subset; fingers, or sub-blocks, within each of the planes, where less than all of the fingers, and different combinations of fingers, in each of the planes can be written; and the bit lines to be programmed. At step 1719, the data from the page buffer 1663 is then programmed into the planes of the array 1684 based on the physical addresses.

One embodiment includes a non-volatile storage apparatus including a plurality of planes, each of the planes having a plurality of non-volatile memory cells arranged into blocks and each of the blocks including a plurality of sub-blocks, the planes including a first subset of one or more planes and a second subset of one or more planes, the first subset and second subset being distinct. A plurality of word lines are connected to the memory cells. The non-volatile storage apparatus also includes one or more control circuits connected to the memory cells and to the word lines, the one or more control circuits configured to: assign host data corresponding to a first range of logical addresses to the first subset of planes, but not to the second subset of planes; assign host data corresponding to a second range of logical addresses to the second subset of planes, but not the first subset of planes; and concurrently program the host data corresponding to the first range of logical addresses into memory cells of a sub-block the first subset of planes along a first of the word lines and program the host data corresponding to the second range of logical addresses into memory cells of a sub-block of the second subset of planes along a second of the word lines, the first word line and second word line being distinct.

One embodiment includes a method including receiving host data corresponding to a first range of logical addresses and assigning the host data corresponding to the first range of logical addresses to a first subset, but not a second subset, of a plurality of planes, each of the planes having a plurality of non-volatile memory cells each connected along one of a plurality of word lines and arranged into blocks and each of the blocks including a plurality of sub-blocks, the planes including the first subset of one or more planes and the second subset of one or more planes, the first subset and second subset being distinct. The method also includes: receiving host data corresponding to a second range of logical addresses; assigning the host data corresponding to the second range of logical addresses to the second subset, but not the first subset, of the planes; and concurrently programing the host data corresponding to the first range of logical addresses into memory cells of a sub-block the first subset planes along a first of the word lines and programing the host data corresponding to the second range of logical addresses into memory cells of a sub-block of the second subset of planes along a second of the word lines, the first word line and second word line being distinct.

One embodiment includes an apparatus including one or more control circuits configured to connect to an array of non-volatile memory cells having a plurality of planes, each of the planes having a plurality of the non-volatile memory cells connected along word lines and arranged into blocks and each of the blocks including a plurality of sub-blocks, the planes including a first subset of one or more planes and a second subset of one or more planes, the first subset and second subset being distinct. The one or more control circuits is configured to: store host data corresponding to a first range of logical addresses in a first write queue; store host data corresponding to a second range of logical addresses in a second write queue; assign the host from the first write queue to the first subset of planes, but not to the second subset of planes; assign the host data from the second write queue to the second subset of planes, but not the first subset of planes; form the host data from one or both of the first write queue and the second write queue into at least a portion of a page of write data; and assign physical addresses on the plurality of planes to which the at least the portion of the page of write data is to be written, the physical addresses independently specifying a word line in each of the first and second subsets of planes and independently specifying sub-blocks within each of the planes.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a non-volatile memory controller configured to receive host data from a host system and transfer the host data to a plurality of planes of non-volatile memory cells on one or more memory die, where the host data have a logical address assigned by the host system having a logical address space divided into zones containing a set amount of data, including a first plurality of zones corresponding to a first range of logical addresses and a second plurality of zones corresponding to a second, distinct range of logical addresses, and where the planes comprise a first subset of a plurality of the planes and a second subset of a plurality of the planes, the non-volatile memory controller comprising:
a first write queue;
a second write queue;
a page buffer; and
one or more control circuits configured to:
determine, for each of a plurality of received zones of host data, whether the zone belongs to the first range of logical addresses or to the second range of logical addresses;
accumulate zones of host data belonging to the first range of logical addresses in the first write queue;
accumulate zones of host data belonging to the second range of logical addresses in the second write queue;
assign corresponding physical addresses to each of the accumulated zones of host data, the zones accumulated in the first write queue being assigned physical addresses in the first, but not the second, subset of planes, and the zones accumulated in the second write queue being assigned physical addresses in the second, but not the first, subset of planes;
assemble the accumulated zones into one or more pages of write data, each page including host data assigned physical addresses in the first subset of planes and host data assigned physical addresses in the second subset of planes;
store the assembled one or more pages in the page buffer; and
transmit one or more of the assembled pages from the page buffer, along with the corresponding physical addresses, to the memory planes for programming each page concurrent into the first subset of planes and second subset of planes at the corresponding assigned physical addresses.

2. The non-volatile storage apparatus of claim 1, wherein each of the plurality of planes comprise a plurality of blocks and the amount of data stored in a zone being less than a data size corresponding to a block from each plane of the first subset and less than a data size corresponding to a block from each plane of the second subset.

3. The non-volatile storage apparatus of claim 2, wherein each of the blocks comprises a plurality of sub-blocks and at least one of the assembled pages includes at least one but less than all of the sub-blocks of a plane from one or both of the first subset and second subset.

4. The non-volatile storage apparatus of claim 3, further comprising:
a memory die comprising the memory cells, wherein the planes are part of a three dimensional NAND architecture, the sub-blocks corresponding to separated vertical regions of each of the planes.

5. The non-volatile storage apparatus of claim 2, wherein the corresponding assigned physical address for each of assembled pages specifies a block number in each of the first subset and the second subset and a word line number within the specified block number in in each of the first subset and the second subset, and
wherein for at least one of the assembled pages the corresponding assigned physical address specified different word line numbers for the first subset and the second subset.

6. The non-volatile storage apparatus of claim 1, further comprising:
a memory die comprising the memory cells; and a control die, separate from and bonded to the memory die.

7. The non-volatile storage apparatus of claim 1, wherein a number of the plurality of planes is four and each of the first and second subsets corresponds to two planes.

8. The non-volatile storage apparatus of claim 1, further comprising:
a memory die comprising the memory cells, the memory die further comprising a memory die page buffer configured to store the transmitted one or more of the assembled pages.

9. A method, comprising:
receiving host data from a host system, the host data having a logical address assigned by the host system that has a logical address space divided into zones containing a set amount of data, including a first plurality of zones corresponding to a first range of logical addresses and a second plurality of zones corresponding to a second, distinct range of logical addresses;
determining, for each of a plurality of received zones of host data, whether the zone belongs to the first range of logical addresses or to the second range of logical addresses;
accumulating zones of host data belonging to the first range of logical addresses in a first write queue;
accumulating zones of host data belonging to the second range of logical addresses in a second write queue;
assigning corresponding physical addresses in a plurality of planes of non-volatile memory cells to each of the accumulated zones of host data, the zones accumulated in the first write queue being assigned physical addresses in a first, but a the second, subset of planes, and the zones accumulated in the second write queue being assigned physical addresses in the second, but not the first, subset of planes;
assembling the accumulated zones into one or more pages of write data, each page including host data assigned physical addresses in the first subset of planes and host data assigned physical addresses in the second subset of planes;
storing the assembled one or more pages in a page buffer; and
transmitting one or more of the assembled pages from the page buffer, along with the corresponding physical addresses, to the memory planes for programming each page concurrent into the first subset of planes and second subset of planes at the corresponding assigned physical addresses.

10. The method of claim 9, wherein each of the plurality of planes comprise a plurality of blocks and the amount of data stored in a zone being less than a data size corresponding to a block from each plane of the first subset and less than a data size corresponding to a block from each plane of the second subset.

11. The method of claim 10, wherein each of the blocks comprises a plurality of sub-blocks and at least one of the assembled pages includes at least one but less than all of the sub-blocks of a plane from one or both of the first subset and second subset.

12. The method of claim 10, wherein the corresponding assigned physical address for each of assembled pages specifies a block number in each of the first subset and the second subset and a word line number within the specified block number in in each of the first subset and the second subset, and wherein for at least one of the assembled pages the corresponding assigned physical address specified different word line numbers for the first subset and the second subset.

13. An apparatus, comprising:

one or more control circuits configured to connect to an array of non-volatile memory cells having a plurality of planes, including a first subset of a plurality of the planes and a second subset of a plurality of the planes, the first subset and second subset being distinct, the one or more control circuits configured to:

receive host data from a host system, the host data having a logical address assigned by the host system that has a logical address space divided into zones containing a set amount of data, including a first plurality of zones corresponding to a first range of logical addresses and a second plurality of zones corresponding to a second, distinct range of logical addresses;

determine, for each of a plurality of received zones of host data, whether the zone belongs to the first range of logical addresses or to the second range of logical addresses;

accumulate zones of host data belonging to the first range of logical addresses in a first write queue;

accumulate zones of host data belonging to the second range of logical addresses in a second write queue;

assign corresponding physical addresses in a plurality of planes of non-volatile memory cells to each of the accumulated zones of host data, the zones accumulated in the first write queue being assigned physical addresses in a first, but a the second, subset of planes, and the zones accumulated in the second write queue being assigned physical addresses in the second, but not the first, subset of planes;

assemble the accumulated zones into one or more pages of write data, each page including host data assigned physical addresses in the first subset of planes and host data assigned physical addresses in the second subset of planes;

store the assembled one or more pages in a page buffer; and transmit one or more of the assembled pages from the page buffer, along with the corresponding physical addresses, to the memory planes for programming each page concurrent into the first subset of planes and second subset of planes at the corresponding assigned physical addresses.

14. The apparatus of claim 13, wherein each of the plurality of planes comprise a plurality of blocks and the amount of data stored in a zone being less than a data size corresponding to a block from each plane of the first subset and less than a data size corresponding to a block from each plane of the second subset.

15. The apparatus of claim 14, wherein each of the blocks comprises a plurality of sub-blocks and at least one of the assembled pages includes at least one but less than all of the sub-blocks of a plane from one or both of the first subset and second subset.

16. The apparatus of claim 15, further comprising:

the array of non-volatile memory cells, wherein the array having a three dimensional NAND architecture and the sub-blocks corresponding to separated vertical regions of each of the planes.

17. The apparatus of claim 13, wherein the corresponding assigned physical address for each of assembled pages specifies a block number in each of the first subset and the second subset and a word line number within the specified block number in in each of the first subset and the second subset, and wherein for at least one of the assembled pages the corresponding assigned physical address specified different word line numbers for the first subset and the second subset.

18. The apparatus of claim 13, wherein one or more of the control circuits are formed on a control die, the apparatus further comprising:

a memory die comprising the memory cells, the memory die separate from and bonded to the control die.

19. The apparatus of claim 18, further comprising:

the memory die further comprising a memory die page buffer configured to store the transmitted one or more of the assembled pages.

20. The apparatus of claim 13, wherein a number of the plurality of planes is four and each of the first and second subsets corresponds to two planes.

* * * * *